(12) United States Patent
Kim et al.

(10) Patent No.: US 9,653,430 B2
(45) Date of Patent: May 16, 2017

(54) SEMICONDUCTOR DEVICES HAVING STACKED STRUCTURES AND METHODS FOR FABRICATING THE SAME

(71) Applicants: Taeyeong Kim, Suwon-si (KR); Byung Lyul Park, Seoul (KR); Seokho Kim, Hwaseong-si (KR); Pil-Kyu Kang, Hwaseong-si (KR); Hyoju Kim, Seoul (KR); Jin Ho An, Seoul (KR); Joo Hee Jang, Hwaseong-si (KR)

(72) Inventors: Taeyeong Kim, Suwon-si (KR); Byung Lyul Park, Seoul (KR); Seokho Kim, Hwaseong-si (KR); Pil-Kyu Kang, Hwaseong-si (KR); Hyoju Kim, Seoul (KR); Jin Ho An, Seoul (KR); Joo Hee Jang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/955,124

(22) Filed: Dec. 1, 2015

(65) Prior Publication Data

US 2016/0155724 A1     Jun. 2, 2016

(30) Foreign Application Priority Data

Dec. 1, 2014 (KR) .................... 10-2014-0169930

(51) Int. Cl.
*H01L 25/065* (2006.01)
*H01L 21/66* (2006.01)
(Continued)

(52) U.S. Cl.
CPC ...... *H01L 25/0657* (2013.01); *H01L 21/6835* (2013.01); *H01L 21/6836* (2013.01); *H01L 23/3135* (2013.01); *H01L 24/73* (2013.01); *H01L 24/92* (2013.01); *H01L 24/94* (2013.01); *H01L 21/76898* (2013.01);
(Continued)

(58) Field of Classification Search
None
See application file for complete search history.

(56) References Cited

U.S. PATENT DOCUMENTS 7,626,260 B2   12/2009  Chung et al.
7,683,459 B2    3/2010  Ma et al.
(Continued)

FOREIGN PATENT DOCUMENTS

JP   2012-114214 A   6/2012
JP   2012-134334 A   7/2012
(Continued)

*Primary Examiner* — Whitney T Moore
(74) *Attorney, Agent, or Firm* — Myers Bigel, P.A.

(57) ABSTRACT

Semiconductor devices having stacked structures and methods for fabricating the same are provided. A semiconductor device includes at least one single block including a first semiconductor chip and a second semiconductor chip stacked thereon. Each of the first and second semiconductor chips includes a semiconductor substrate including a through-electrode, a circuit layer on a front surface of the semiconductor substrate, and a front pad that is provided in the circuit layer and is electrically connected to the through-electrode. The surfaces of the semiconductor substrates face each other. The circuit layers directly contact each other such that the semiconductor chips are bonded to each other.

20 Claims, 24 Drawing Sheets

(51) Int. Cl.
*H01L 23/00* (2006.01)
*H01L 23/48* (2006.01)
*H01L 23/528* (2006.01)
*H01L 23/31* (2006.01)
*H01L 21/683* (2006.01)
*H01L 21/768* (2006.01)

(52) U.S. Cl.
CPC ............ *H01L 22/32* (2013.01); *H01L 23/481* (2013.01); *H01L 24/03* (2013.01); *H01L 24/05* (2013.01); *H01L 24/08* (2013.01); *H01L 24/09* (2013.01); *H01L 24/11* (2013.01); *H01L 24/13* (2013.01); *H01L 24/14* (2013.01); *H01L 24/16* (2013.01); *H01L 24/80* (2013.01); *H01L 24/81* (2013.01); *H01L 2221/68327* (2013.01); *H01L 2224/03002* (2013.01); *H01L 2224/0392* (2013.01); *H01L 2224/03616* (2013.01); *H01L 2224/04* (2013.01); *H01L 2224/0557* (2013.01); *H01L 2224/05624* (2013.01); *H01L 2224/05647* (2013.01); *H01L 2224/08146* (2013.01); *H01L 2224/09181* (2013.01); *H01L 2224/131* (2013.01); *H01L 2224/13025* (2013.01); *H01L 2224/14515* (2013.01); *H01L 2224/16146* (2013.01); *H01L 2224/73251* (2013.01); *H01L 2224/80201* (2013.01); *H01L 2224/80203* (2013.01); *H01L 2224/80895* (2013.01); *H01L 2224/80896* (2013.01); *H01L 2224/80907* (2013.01); *H01L 2224/92* (2013.01); *H01L 2224/9222* (2013.01); *H01L 2224/94* (2013.01); *H01L 2225/06517* (2013.01); *H01L 2225/06541* (2013.01); *H01L 2225/06555* (2013.01); *H01L 2225/06596* (2013.01); *H01L 2924/15311* (2013.01)

(56) References Cited

U.S. PATENT DOCUMENTS

| | | | |
|---|---|---|---|
| 7,915,083 | B1 | 3/2011 | Sasaki et al. |
| 7,968,374 | B2 | 6/2011 | Sasaki et al. |
| 8,546,188 | B2 | 10/2013 | Liu et al. |
| 2013/0234339 | A1 | 9/2013 | Higashi et al. |
| 2015/0279825 | A1* | 10/2015 | Kang ............... H01L 25/50 257/48 |

FOREIGN PATENT DOCUMENTS

| | | |
|---|---|---|
| KR | 2001-0094409 A | 11/2001 |
| KR | 10-0537835 B1 | 12/2005 |

* cited by examiner

SEMICONDUCTOR DEVICES HAVING STACKED STRUCTURES AND METHODS FOR FABRICATING THE SAME

CROSS-REFERENCE TO RELATED APPLICATIONS

This U.S. nonprovisional patent application claims priority under 35 U.S.C. §119 of Korean Patent Application 10-2014-0169930 filed on Dec. 1, 2014, the entire contents of which are hereby incorporated by reference.

BACKGROUND

The present inventive concept relates to semiconductors and, more particularly, to semiconductor devices having stacked structures and methods for fabricating the same.

In the semiconductor industry, packaging techniques have been devised to meet the demand for high capacity, small thickness and reduced size of semiconductor device and electronic products. One approach is to vertically stack a plurality of semiconductor chips so as to accomplish a chip stack with high density. This technique has merits capable of integrating various kinds semiconductor chips in a smaller area compared to conventional packages with one semiconductor chip.

SUMMARY

Embodiments of the present inventive concept provide semiconductor devices having stacked structures and methods for fabricating the same in which a plurality of chips are stacked in various techniques.

Embodiments of the present inventive concept provide semiconductor devices having stacked structures and methods for fabricating the same capable of reducing the thickness of stacking structure.

According to an exemplary embodiment of the present inventive concept, a semiconductor device may comprise at least one single block including a first semiconductor chip and a second semiconductor chip stacked thereon. The first semiconductor chip may comprise: a first semiconductor substrate including a first through-electrode; a first circuit layer on a front surface of the first semiconductor substrate; and a first front pad in the first circuit layer and is electrically connected to the first through-electrode. The second semiconductor chip may comprise: a second semiconductor substrate including a second through-electrode; a second circuit layer on a front surface of the second semiconductor substrate; and a second front pad in the second circuit layer and is electrically connected to the second through-electrode. The front surface of the first semiconductor substrate may face the front surface of the second semiconductor substrate. The first circuit layer may directly contact the second circuit layer such that the first semiconductor chip may be bonded to the second semiconductor chip.

In an exemplary embodiment, the first semiconductor chip may further comprise at least one first test pad that is electrically connected to the first through-electrode and is configured to electrically test the first semiconductor chip. The second semiconductor chip may further comprise at least one second test pad that is electrically connected to the second through-electrode and is configured to electrically test the second semiconductor chip.

In an exemplary embodiment, the first circuit layer may comprise a first upper insulating layer whose surface is coplanar with a surface of the first front pad. The first upper insulating layer may be configured to inhibit a constituent of the first front pad from being diffused. The second circuit layer may comprise a second upper insulating layer whose surface is coplanar with a surface of the second front pad. The second upper insulating layer may be configured to inhibit a constituent of the second front pad from being diffused. The surface of the first upper insulating layer may directly contact the surface of the second upper insulating layer.

In an exemplary embodiment, the first circuit layer may further comprise a first interlayer dielectric layer between the first semiconductor substrate and the first upper insulating layer to cover a first integrated circuit on the first semiconductor substrate. The second circuit layer may further comprise a second interlayer dielectric layer between the second semiconductor substrate and the second upper insulating layer to cover a second integrated circuit on the second semiconductor substrate.

In an exemplary embodiment, the first and second front pads may directly contact each other such that the first and second through-electrodes may be electrically connected to each other.

In an exemplary embodiment, the first semiconductor chip may further comprise a first backside pad on a backside surface of the first semiconductor substrate electrically connected to the first through-electrode, and the second semiconductor chip may further comprise a second backside pad on a backside surface of the second semiconductor substrate electrically connected to the second through-electrode.

In an exemplary embodiment, at least one of the first and second semiconductor chips may further comprise a backside insulating layer on the backside surface of the corresponding semiconductor substrate. The backside insulating layer may include a surface coplanar with a surface of corresponding backside pad.

In an exemplary embodiment, the device may further comprise an interconnection terminal coupled to at least one of the first and second backside pads.

In an exemplary embodiment, the at least one single block may comprise a first single block and a second single block stacked on the first single block. Each of the first and second single blocks may have a face-to-face structure in which the first circuit layer of the corresponding first semiconductor chip is directly coupled to the second circuit layer of the corresponding second semiconductor chip. The first and second single blocks may have a back-to-back structure in which a backside surface of the first semiconductor substrate included in the first single block faces a backside surface of the second semiconductor substrate included in the second single block.

In an exemplary embodiment, the device may further comprise an interconnection terminal between the first and second single blocks to electrically connect the first single block to the second single block.

In an exemplary embodiment, each of the first and second single blocks may have the face-to-face structure in which the first circuit layer of the corresponding first semiconductor chip is coupled to the second circuit layer of the corresponding second semiconductor chip without an interval between the first and second circuit layers. The first and second single blocks may have the back-to-face structure in which the first single block is spaced from the second single block by the interconnection terminal.

In an exemplary embodiment, the device may further comprise a third semiconductor chip including a third semiconductor substrate having a front surface on which the at least one single block is mounted and a backside surface opposite the front surface of the third semiconductor substrate. The third semiconductor chip may further include: a third through-electrode included in the third semiconductor substrate; a third circuit layer on the front surface of the third semiconductor substrate; and a third front pad in the third circuit layer and is electrically connected to the third through-electrode.

According to another exemplary embodiment of the present inventive concept, a semiconductor device may comprise at least one single block comprising at least two semiconductor chips. Each of the two semiconductor chips may include: a semiconductor substrate having an active surface on which an integrated circuit is disposed; a circuit layer having an interlayer dielectric layer on the active surface of the semiconductor substrate and an upper insulating layer on the interlayer dielectric layer; and a front pad in the circuit layer and electrically connected to the integrated circuit. The two semiconductor chips may be stacked one atop the other to have a face-to-face structure in which the active surfaces of the semiconductor substrates face each other. A surface of the front pad may be coplanar with a surface of the corresponding upper insulating layer such that the upper insulating layers of the two semiconductor chips may directly contact each other and the front pads of the two semiconductor chip may directly contact each other.

In another exemplary embodiment, the two semiconductor chips may be bonded to each other without intervals between the upper insulating layers and between the front pads. The two semiconductor chips may be electrically connected to each other by the direct contact of the front pads.

In another exemplary embodiment, each of the two semiconductor chips may further comprise: a plurality of through-electrodes penetrating the semiconductor substrate and electrically connected to the integrated circuit; and a plurality of backside pads on the inactive surface of the semiconductor substrate and electrically connected to the plurality of through-electrodes.

In another exemplary embodiment, each of the two semiconductor chips may further comprise at least one test pad electrically connected to the through-electrode.

In another exemplary embodiment, each of the two semiconductor chips may further comprise: at least one test through-electrode penetrating the semiconductor substrate; and at least one test pad electrically connected to the at least one test through-electrode.

In another exemplary embodiment, the at least one single block may comprise a first single block and a second single block stacked on the first single block. The first and second single blocks may each comprise the two semiconductor chips that are stacked to have the face-to-face structure.

In another exemplary embodiment, the device may further comprise a plurality of interconnection terminals between backside pads in each of the first and second single blocks. The first and second single blocks may be electrically connected to each other by the interconnection terminals.

In another exemplary embodiment, each of the two semiconductor chips may further comprise a backside insulating layer on the inactive surface of the semiconductor substrate. A surface of the backside insulating layer may be coplanar with a surface of the backside pad.

In another exemplary embodiment, the at least one single block may comprise a first single block and a second single block stacked on the first single block. Each of the first and second single blocks may comprise the two semiconductor chips that are stacked to have the face-to-face structure. The first and second single blocks may directly contact each other without intervals between the backside insulating layers and between the backside pads.

According to an exemplary embodiment of the present inventive concept, a method for fabricating a semiconductor device may comprise: providing two wafers each including a front surface on which a circuit layer is provided, a backside surface opposite the front surface, a plurality of through-electrodes penetrating the wafer but not reaching the backside surface, and a plurality of front pads in the circuit layer to be electrically connected to the through-electrodes; stacking the wafers to mutually contact the circuit layers of the wafers; grinding the backside surfaces of the wafers to expose the through-electrodes; forming backside pads that are electrically connected to the corresponding through-electrodes; and dicing the stacked wafers to form a single block comprising a first semiconductor chip and a second semiconductor chip stacked on the first semiconductor chip. The circuit layers included in the first and second semiconductor chip may directly contact each other.

In an exemplary embodiment, the circuit layer may comprise: an interlayer dielectric layer covering an integrated circuit provided on the front surface of corresponding wafer; and an upper insulating layer on the interlayer dielectric layer configured to inhibit a constituent of the front pad from being diffused.

In an exemplary embodiment, the stacking the wafers to mutually contact the circuit layers of the wafers may comprise stacking the wafers to face the circuit layers toward each other, such that the upper insulating layers and the front pads may directly contact each other, respectively.

In an exemplary embodiment, the forming the single block may comprise: forming a stacked chip having the face-to-face structure in which the upper insulating layers and the front pads respectively contact each other and front surfaces of the first and second semiconductor chips face each other.

In an exemplary embodiment, the method may further comprise forming a plurality of interconnection terminals coupled to backside pads of at least one of the wafers.

In an exemplary embodiment, dicing the stacked wafers to form a single block comprises dicing the stacked wafers to form a plurality of single blocks. The method may further comprise stacking the single blocks to form a double block. Each of the single blocks may constitute a face-to-face structure in which front surfaces of the first and second semiconductor chips face each other. The single blocks may constitute a back-to-back structure in which a backside surface of the first semiconductor chip included in one of the single blocks faces a backside surface of the second semiconductor chip included in another of the single blocks.

In an exemplary embodiment, the method may further comprise forming a plurality of interconnection terminals between the single blocks. The interconnection terminals may electrically connect the through-electrodes of one of the single blocks to the through-electrodes of another of the single blocks.

In an exemplary embodiment, the method may further comprise forming a backside insulating layer on the corresponding grinded backside surface. The backside insulating layer may have a surface that is coplanar with a surface of corresponding backside pad.

In an exemplary embodiment, dicing the stacked wafers to form a single block comprises dicing the stacked wafers to form a plurality of single blocks. The method may further comprise stacking the single blocks to form a double block. Each of the single blocks may constitute a face-to-face structure in which front surfaces of the first and second semiconductor chips face each other. The single blocks may constitute a back-to-back structure in which a backside surface of the first semiconductor chip included in one of the single blocks faces a backside surface of the second semiconductor chip included in another of the single blocks.

In an exemplary embodiment, the method may further comprise mounting the at least one single block on a third semiconductor chip. The third semiconductor chip may have a size greater than that of the at least one single block.

In an exemplary embodiment, each of the two wafers may further comprise a test pad electrically connected to at least one of the through-electrodes.

According to another exemplary embodiment of the present inventive concept, a method for fabricating a semiconductor device may comprise: providing a first wafer comprising a first front surface on which a first circuit layer is provided, a first backside surface opposite the first front surface, a plurality of first through-electrodes penetrating the first wafer but not reaching the first backside surface, and a plurality of first front pads in the first circuit layer electrically connected to the first through-electrodes; providing a second wafer comprising a second front surface on which a second circuit layer is provided, a second backside surface opposite the second front surface, a plurality of second through-electrodes penetrating the second wafer but not reaching the second backside surface, and a plurality of second front pads in the second circuit layer electrically connected to the second through-electrodes; stacking the second wafer on the first wafer, such that the first and second circuit layers contact each other; grinding the first and second backside surfaces to expose the first and second through-electrodes; forming first backside pads and second backside pads on the first and second backside surfaces and electrically connected to the first and second through-electrodes, respectively; and dicing the first and second wafers to form at least one single block comprising the diced second wafer stacked on the diced first wafer. The diced first circuit layer may directly contact the diced second circuit layer.

In another exemplary embodiment, the at least one single block may comprise: a first semiconductor chip comprising a first semiconductor substrate formed by dicing the first wafer, at least one of the first through-electrodes penetrating the first semiconductor substrate, at least one of the first front pads, and at least one of the first backside pads; and a second semiconductor chip comprising a second semiconductor substrate formed by dicing the second wafer, at least one of the second through-electrodes penetrating the second semiconductor substrate, and at least one of the second front pads, and at least one of the second backside pads. The at least one of the first through-electrodes may be electrically connected to the at least one of the second through-electrodes. The at least one of the first front pads may directly contact the at least one of the second front pads.

In another exemplary embodiment, the first semiconductor chip may further comprise: a first interlayer dielectric layer covering a first integrated circuit provided on the first semiconductor substrate; and a first upper insulating layer on the first interlayer dielectric layer configured to inhibit a constituent of the at least one of the first front pads from being diffused. The second semiconductor chip may further comprise: a second interlayer dielectric layer covering a second integrated circuit provided on the second semiconductor substrate; and a second upper insulating layer on the second interlayer dielectric layer configured to inhibit a constituent of the at least one of the second front pads from being diffused. The first upper insulating layer may directly contact the second upper insulating layer.

In another exemplary embodiment, the first semiconductor chip may further comprise at least one first test pad electrically connected to the at least one of the first through-electrodes. The second semiconductor chip may further comprise at least one second test pad electrically connected to the at least one of the second through-electrodes.

In another exemplary embodiment, the at least one single block comprises a plurality of single blocks. The method may further comprise stacking the single blocks to form a double block. The at least one of the first front pads included in one of the single blocks may face the at least one of the second front pads included in another of the single blocks.

In another exemplary embodiment, the method may further comprise forming at least one interconnection terminal between the single blocks to electrically connect the single blocks to each other. The single blocks may be spaced apart by the interconnection terminal.

In another exemplary embodiment, the method may further comprise forming a second single block on the at least one single block. The second single block may comprise the first semiconductor chip and a third semiconductor chip stacked on the first semiconductor chip included in the second single block. The third semiconductor chip may comprise a third semiconductor substrate and a third front pad in direct contact with the first front pad of the first semiconductor chip included in the second single block. The third semiconductor substrate may have a thickness greater than that of at least one of the first and second semiconductor substrates.

According to other exemplary embodiment of the present inventive concept, a semiconductor device may comprise: a first single block comprising two first semiconductor chips that are stacked one atop the other and having a first face-to-face structure in which front surfaces of the first semiconductor chips face each other; and a second single block, which is stacked on the first single block, comprising two second semiconductor chips that are stacked one atop the other and having a second face-to-face structure in which front surfaces of the second semiconductor chips face each other. Each of the first semiconductor chips may comprise: a first semiconductor substrate having a first top surface on which a first circuit layer is provided and a first bottom surface opposite the first top surface; a first through-electrode penetrating the first semiconductor substrate and electrically connected to the first circuit layer; a first front pad in the first circuit layer and electrically connected to the first through-electrode; a first interlayer dielectric layer on the first top surface of the first semiconductor substrate to cover the first circuit layer; and a first upper insulating layer on the first interlayer dielectric layer configured to inhibit a constituent of the first front pad from being diffused. The first front surfaces of the first semiconductor substrates included in the first single block may face each other to constitute the first face-to-face structure such that the first upper insulating layers and the first front pads of the first semiconductor chips may respectively face each other.

In other exemplary embodiment, the first semiconductor chips may respectively further comprise first test pads electrically connected to corresponding first through-electrodes.

In other exemplary embodiment, each of the second semiconductor chips may comprise: a second semiconductor substrate having a second top surface on which a second circuit layer is provided and a second bottom surface opposite the second top surface; a second through-electrode penetrating the second semiconductor substrate and electrically connected to the second circuit layer; a second front pad in the second circuit layer and electrically connected to the second through-electrode; a second interlayer dielectric layer on the second top surface of the second semiconductor substrate to cover the second circuit layer; and a second upper insulating layer on the second interlayer dielectric layer configured to inhibit a constituent of the second front pad from being diffused. The second front surfaces of the second semiconductor substrates included in the second single block may face each other to constitute the second face-to-face structure such that the second upper insulating layers and the second front pads of the second semiconductor chips may respectively face each other.

In other exemplary embodiment, the first semiconductor chips may respectively further comprise first backside pads on the first bottom surfaces of corresponding first semiconductor substrates and electrically connected to corresponding first through-electrodes, and the second semiconductor chips may respectively further comprise second backside pads on the second bottom surfaces of corresponding second semiconductor substrates and electrically connected to corresponding second through-electrodes.

In other exemplary embodiment, the first and second single blocks may be bonded to each other to have a back-to-back structure in which the first backside pad of the first semiconductor chip included in one of the first and second single blocks faces the second backside pad of the second semiconductor chip included in the other of the first and second single blocks.

In other exemplary embodiment, the device may further comprise at least one interconnection terminal between the first and second single blocks to electrically connect the first backside pad of the first semiconductor chip to the second backside pad of the second semiconductor chip. The first single block may be spaced from the second single block by the interconnection terminal.

In other exemplary embodiment, the second semiconductor chips of the second single block may comprise: a third semiconductor chip on the first single block, the third semiconductor chip including a third top surface and a third bottom surface opposite the third top surface; and a fourth semiconductor chip on the third semiconductor chip, the fourth semiconductor chip including a fourth top surface and a fourth bottom surface opposite the fourth top surface. The third and fourth semiconductor chips may constitute the second face-to-face structure in which the third top surface of the third semiconductor chip faces the fourth top surface of the fourth semiconductor chip. The fourth semiconductor chip may have a thickness greater than that of the third semiconductor chip.

In other exemplary embodiment, the device may further comprise at least one interconnection terminal between the first and second single blocks to electrically connect the first single block to the second single block. The first single block may be spaced from the second single block by the interconnection terminal.

In other exemplary embodiment, the device may further comprise a base chip on which the first single block is mounted. The base chip may have a size greater than that of the first semiconductor chip included in the first single block.

In other exemplary embodiment, the base chip may comprise: a base substrate comprising a top surface on which the first single block is mounted and a bottom surface opposite the top surface; a through-electrode penetrating the base substrate and vertically aligned with the through-electrode of the first single block; a base circuit layer on the top surface of the base substrate; a front pad electrically connected to the through-electrode of the first single block; and a backside pad on the bottom surface of the base substrate.

In other exemplary embodiment, the device may further comprise a mold layer provided on the base chip so as to encapsulate the first and second single blocks.

Other methods, systems, and/or devices according to embodiments of the inventive subject matter will be or become apparent to one with skill in the art upon review of the following drawings and detailed description. It is intended that all such additional methods, systems, and/or devices be included within this description, be within the scope of the present inventive concepts, and be protected by the accompanying claims. Moreover, it is intended that all embodiments disclosed herein can be implemented separately or combined in any way and/or combination

BRIEF DESCRIPTION OF THE DRAWINGS

The foregoing and other features and advantages of exemplary embodiments of inventive concepts will be apparent from the more particular description of non-limiting embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings.

DETAILED DESCRIPTION OF EXEMPLARY EMBODIMENTS

Figure 1A:
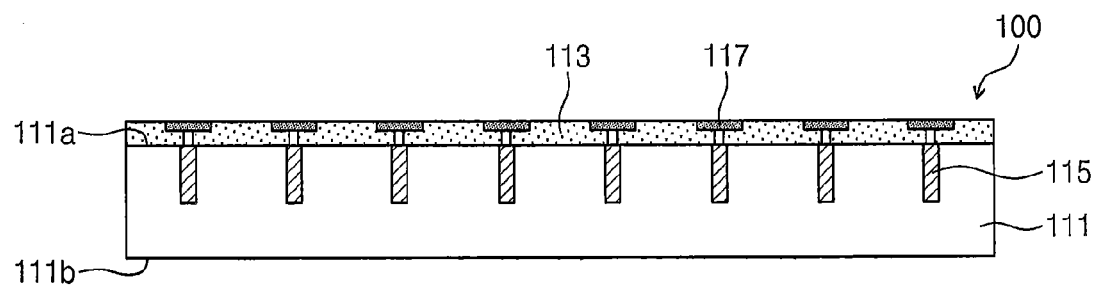
FIGS. 1A to 1H are cross-sectional views illustrating a method for fabricating a semiconductor device according to an exemplary embodiment of the present inventive concept.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout the description. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and this specification and will not be interpreted in an idealized or overly formal sense unless expressly so defined herein.

FIGS. 1A to 1H are cross-sectional views illustrating a method for fabricating a semiconductor device according to an exemplary embodiment of the present inventive concept. FIG. 1I is a cross-sectional view illustrating another example of FIG. 1H. FIG. 2A is an enlarged cross-sectional view of a portion of FIG. 1H. FIG. 2B is a cross-sectional view illustrating another example of FIG. 2A.

Figure 2A:
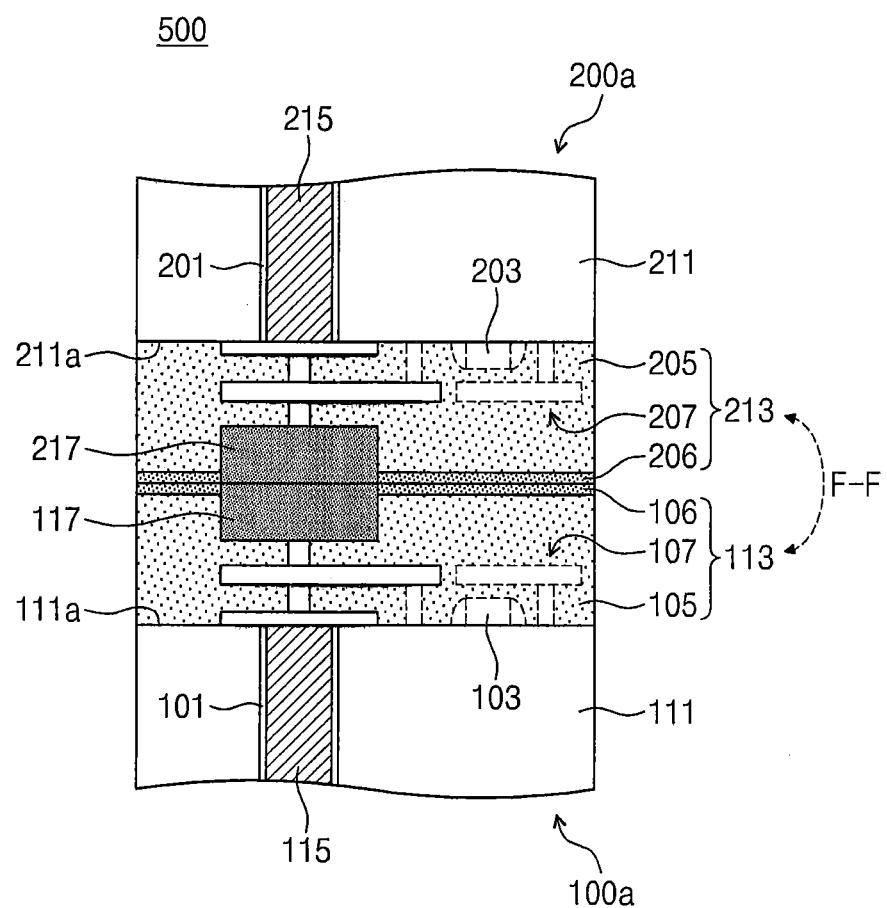
FIG. 2A is an enlarged cross-sectional view of a portion of FIG. 1H.
Figure 2B:
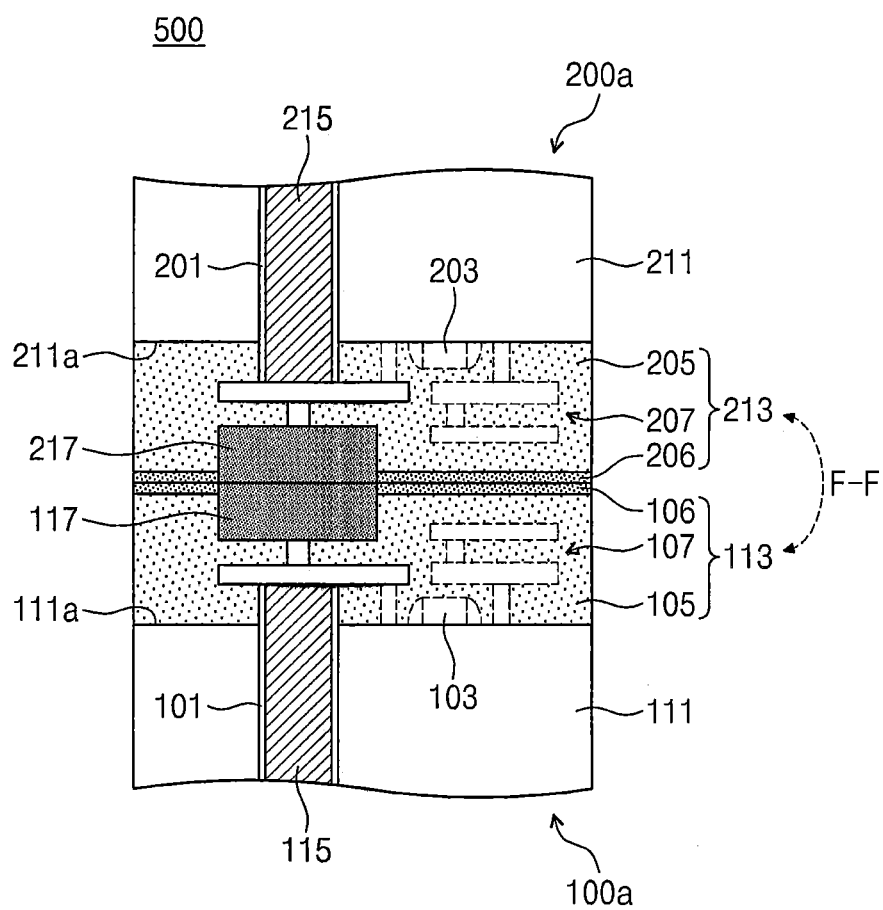
FIG. 2B is a cross-sectional view illustrating another example of FIG. 2A.

Referring to FIG. 1A, a first semiconductor chip 100 may be provided. The first semiconductor chip 100 may be a wafer-level chip including a first semiconductor substrate 111, a first circuit layer 113 that lies on the first semiconductor substrate 111 and has at least one first front pad 117, and at least one first through-electrode 115 that partially penetrates the first semiconductor substrate 111.

The first semiconductor substrate 111 may be, for example, a silicon wafer including a front surface 111a on which the first circuit layer 113 is formed and a backside surface 111b opposite the front surface 111a. The first circuit layer 113 may include an integrated circuit and single-layered or multi-layered metal lines that electrically connect the integrated circuit to the first through-electrode 115 and/or the first front pad 117. The integrated circuit may include a memory circuit, a logic circuit, or a combination thereof.

The first front pad 117 may include a metal, such as copper, aluminum, or an alloy thereof. For example, the first front pad 117 may include copper. The first front pad 117 may be formed by a damascene process and may not protrude over the first circuit layer 113.

Figure 1B:
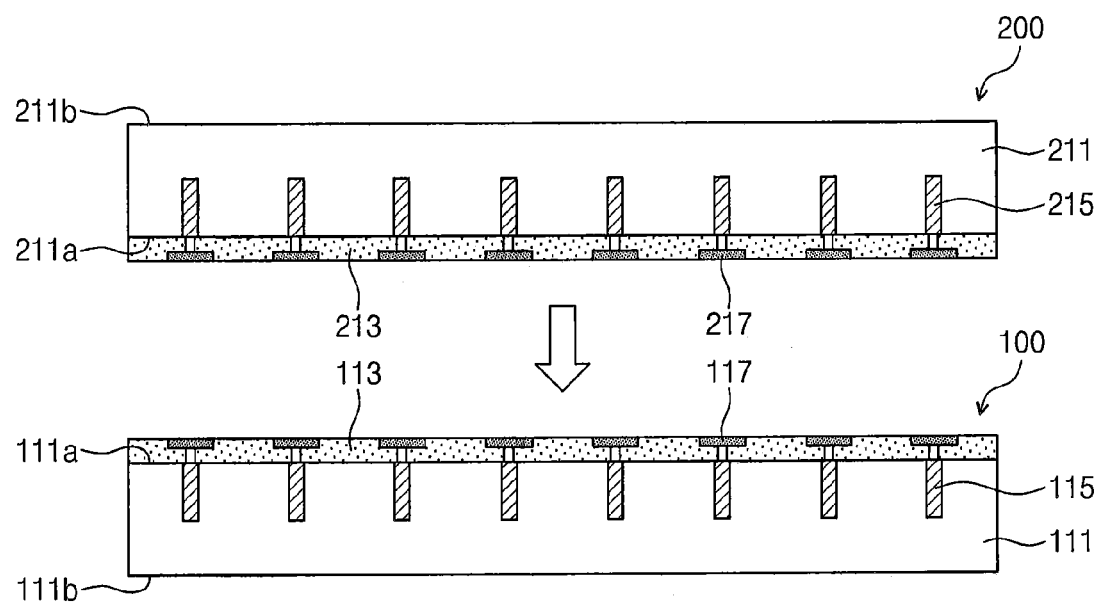

Referring to FIG. 1B, a second semiconductor chip 200 may be provided on the first semiconductor chip 100. The second semiconductor chip 200 may include structural features substantially identical or similar to those of the first semiconductor chip 100. For example, the second semiconductor chip 200 may be a wafer-level chip including a second semiconductor substrate 211, a second circuit layer 213 that lies on the second semiconductor substrate 211 and has at least one second front pad 217, and at least one second through-electrode 215 that partially penetrates the second semiconductor substrate 211.

The second semiconductor substrate 211 may be, for example, a silicon wafer including a front surface 211a on which the second circuit layer 213 is formed and a backside surface 211b opposite the front surface 211a. The second circuit layer 213 may include an integrated circuit and single-layered or multi-layered metal lines that electrically connect the integrated circuit to the second through-electrode 215 and/or the second front pad 217. The integrated circuit may include a memory circuit, a logic circuit, or a combination thereof.

The second front pad 217 may include a metal such as copper, aluminum, or an alloy thereof. For example, the second front pad 217 may include copper. The second front pad 217 may be formed by a damascene process and may not protrude over the second circuit layer 213. The second semiconductor chip 200 may be turned upside down and stacked on the first semiconductor chip 100.

The first and second semiconductor chips 100 and 200 may be stacked one atop the other to have a face-to-face structure F-F in which the first circuit layer 113 faces the second circuit layer 213. For example, the second semiconductor chip 200 may be in a mirror image orientation with respect to the first semiconductor chip 100. As a result, the second through-electrode 215 may be vertically aligned with the first through-electrode 115, and the second front pad 217 may be vertically aligned with the first front pad 117.

After the aforementioned stacking process, the first and second semiconductor chips 100 and 200 may be bonded to each other under a high temperature condition, and optionally with high pressure. Alternatively, the stacking and bondage processes may be performed simultaneously at a high temperature and optionally with high pressure.

Figure 1C:
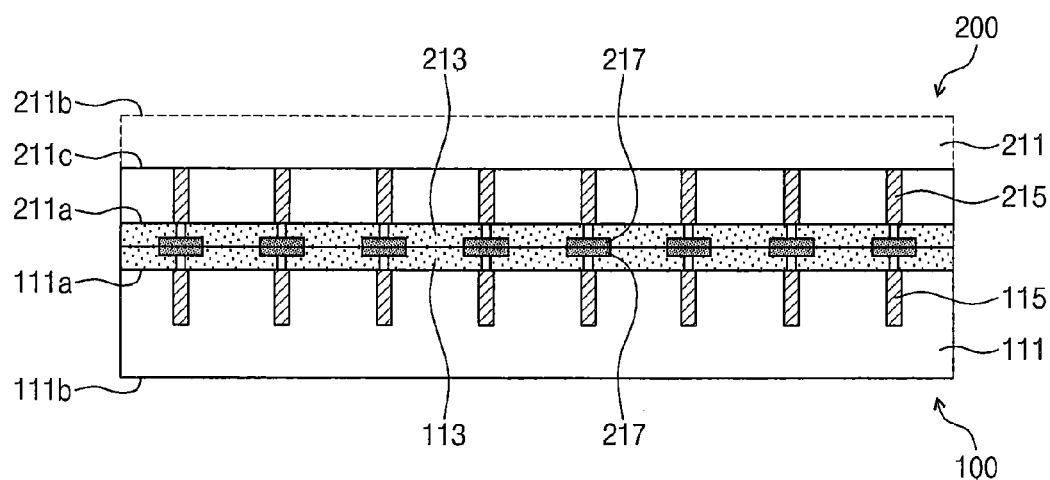

Referring to FIG. 1C, the second semiconductor chip 200 may be thinned. For example, the backside surface 211b of the second semiconductor chip 200 may be grinded down to thin the second semiconductor chip 200. The thinning of the second semiconductor chip 200 may reveal a recessed second backside surface 211c through which the second through-electrodes 215 are exposed. The thinning of the second semiconductor chip 200 may reduce a stacking thickness of the first and second semiconductor chips 100 and 200.

When a substrate is grinded down, a carrier may be used for supporting the substrate. In an exemplary embodiment, when the second semiconductor chip 200 is grinded down, the first semiconductor chip 100 may serve as a carrier, which supports the second semiconductor chip 200. In the second semiconductor chip 200, the front surface 211a may correspond to an active surface and the backside surface 211c may correspond to an inactive surface.

The first and second semiconductor chips 100 and 200 may be the same type or different chips. For example, the first and second semiconductor chips 100 and 200 may be the same chip having identical size, structure, and function.

Figure 1D:
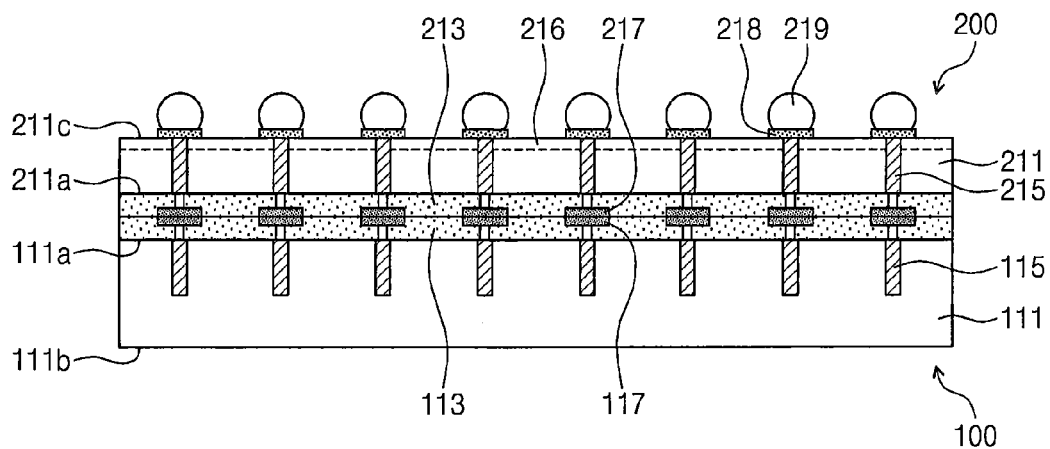

Referring to FIG. 1D, a plurality of second backside pads 218 may be formed on the second backside surface 211c of the second semiconductor chip 200 to be electrically connected to the second through-electrodes 215. The second backside pads 218 may include a metal, such as copper, aluminum, or an alloy thereof. Selectively, a plurality of terminals 219, such as solder balls may be further formed on the second backside pads 218. Alternatively, the terminals 219 may not be formed.

Prior to the formation of the second backside pads 218, an insulating layer 216 may be formed to cover the second backside surface 211c of the second semiconductor chip 200. The insulating layer 216 may electrically insulate the second backside pads 218 from the second semiconductor substrate 211. Descriptions and illustrations of the insulating layer 216 will be omitted hereinafter for brevity.

Figure 1E:
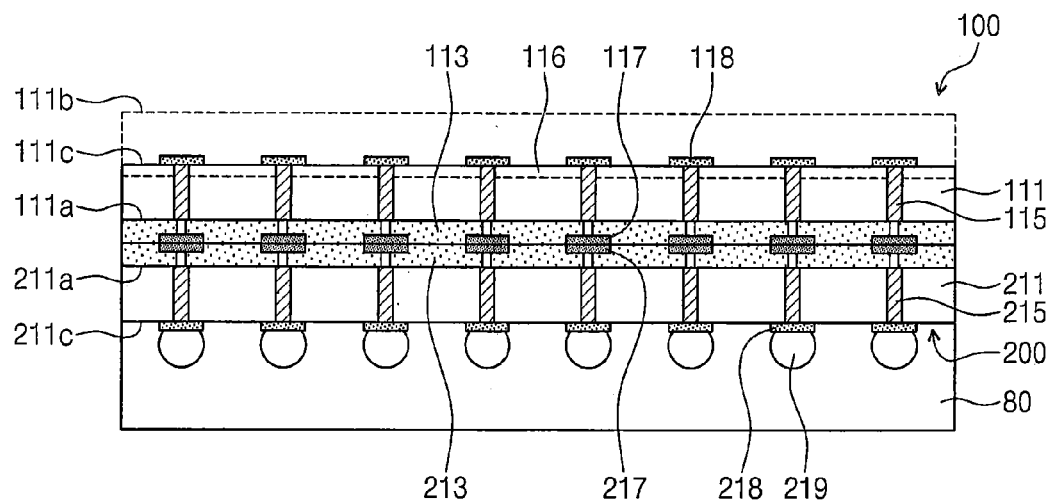

Referring to FIG. 1E, the first semiconductor chip 100 may be thinned and a plurality of first backside pads 118 may be formed on the first semiconductor chip 100. For example, the backside surface 111b of the first semiconductor chip 100 may be grinded down to thin the first semiconductor chip 100. The thinning of the first semiconductor chip 100 may reveal a recessed second backside surface 111c through which the first through-electrodes 115 may be exposed. In the first semiconductor chip 100, the front surface 111a may correspond to an active surface and the second backside surface 111c may correspond to an inactive surface.

When the first semiconductor chip 100 is thinned, a carrier 80 may be used. For example, the first semiconductor chip 100 may be grinded down while the carrier 80 is attached to the second backside surface 211c of the second semiconductor chip 200. The carrier 80 may include a bare wafer or a glass substrate.

The first backside pads 118 may be formed on the second backside surface 111c of the first semiconductor chip 100 to be electrically connected to the first through-electrodes 115.

The first backside pads 118 may include a metal, such as copper, aluminum, or an alloy thereof. Selectively, a plurality of terminals such as solder balls may be further formed to be coupled to the first backside pads 118.

Prior to the formation of the first backside pads 118, an insulating layer 116 may be formed to cover the second backside surface 111c of the first semiconductor chip 100. The insulating layer 116 may electrically insulate the first backside pads 118 from the first semiconductor substrate 111. Descriptions and illustrations of the insulating layer 116 will be omitted hereinafter for brevity.

Figure 1F:
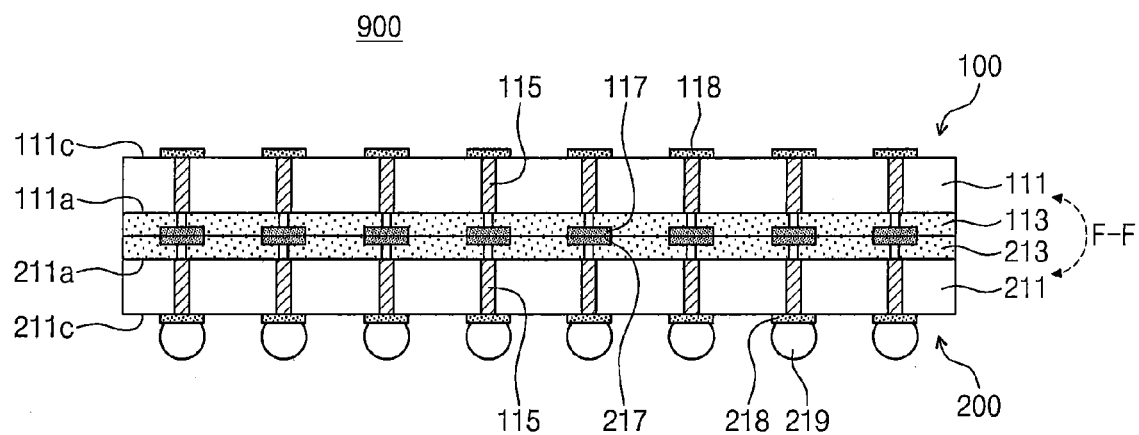

Referring to FIG. 1F, the aforementioned processes may fabricate a wafer-level chip stack 900 comprising the second semiconductor chip 200 including the second through-electrodes 215 stacked on the first semiconductor chip 100 including the first through-electrodes 115. In an exemplary embodiment, the first and second semiconductor chips 100 and 200 are grinded down, such that the thickness of the chip stack 900 may be reduced. The chip stack 900 may have a face-to-face structure F-F in which the first and second semiconductor chips 100 and 200 are bonded to each other in such a way that the first circuit layer 113 faces the second circuit layer 213.

Figure 1G:
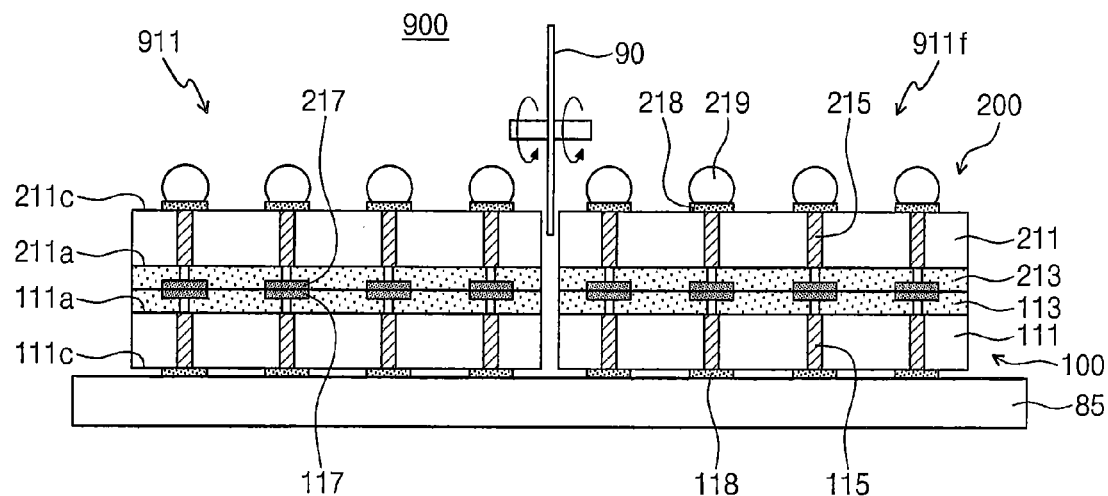

Referring to FIG. 1G, the wafer-level chip stack 900 may be divided into a plurality of semiconductor devices 911 and 911f each having a chip-level stacked structure. For example, a cutting tool 90 such as a dicing blade or a laser may cut the chip stack 900 into the semiconductor devices 911 and 911f.

A die attach film 85 may adhere to the chip stack 900 when the dicing process is performed. For example, the die attach film 85 may adhere to the first backside pads 118 or the second backside surface 111c of the first semiconductor substrate 111. Alternatively, in case that the terminals 219 are not formed, the die attach film 85 may adhere to the second backside surface 211c of the second semiconductor substrate 211.

Figure 1H:
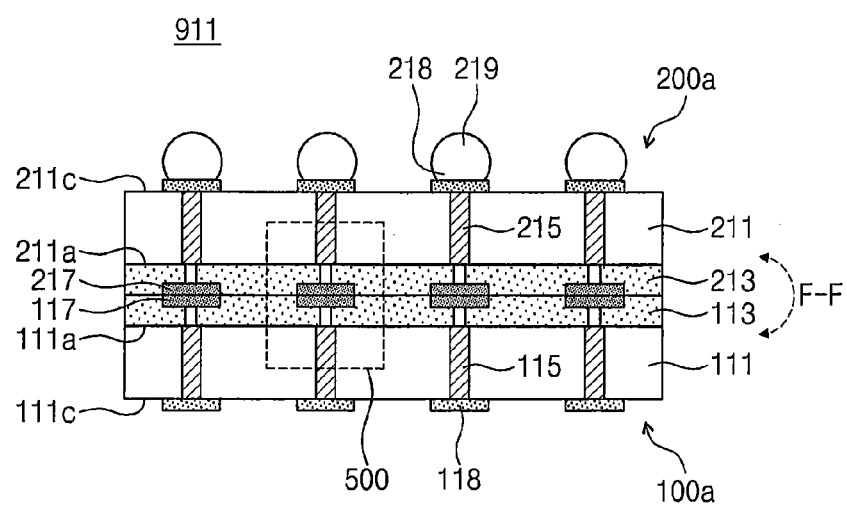
Figure 1I:
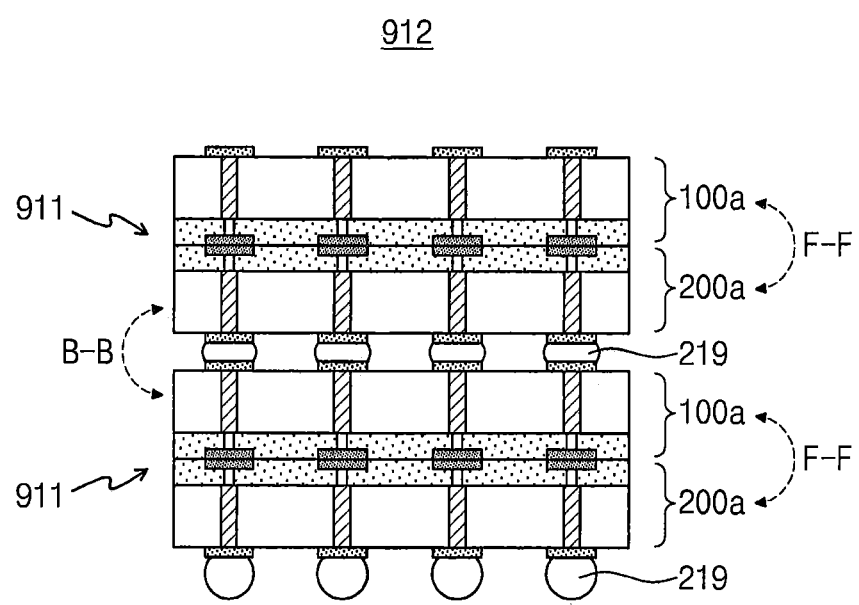
FIG. 1I is a cross-sectional view illustrating another example of FIG. 1H.

Referring to FIG. 1H, each of the semiconductor devices 911 and 911f may constitute a single block in which a chip-level second semiconductor chip 200a is stacked on a chip-level first semiconductor chip 100a. The chip-level semiconductor device having the stacked structure can be also referred to hereinafter as the single block.

As shown in FIG. 1F, the chip stack 900 may be formed by stacking wafers, which may cause warpage. Once a chip is determined to have faults, i.e., a bad chip, then the chip stack 900 may be discarded.

In an exemplary embodiment, the wafer stacking is performed one time such that the chip stack 900 is formed to have a two-story wafer-level stack structure as illustrated in FIG. 1F. As a result, the chip stack 900 may have no or reduced warpage compared with a chip stack having a structure of three-story wafer-level stack or more. Next, as shown in FIG. 1G, the dicing process may be performed to form the single blocks 911 and 911f, and then an electrical test may be performed on the single blocks 911 and 911f.

For example, the dicing process may be followed by an electrical test. Alternatively, the dicing process may be performed prior to the electrical test. Assuming that, as a result of the electrical test, one 911 of the single blocks 911 and 911f is determined as a good chip and the other 911f is determined as a bad chip, it may be needed to discard or renounce the semiconductor device 911f. Although the semiconductor device 911f is useless, wafer consumption may be reduced because the semiconductor device 911f is the two-story structure.

The single block 911 determined as a good chip may be selected to form a multi-story structure, which will be described later with reference to FIG. 1I. In an exemplary embodiment, a plurality of the single blocks 911 determined as good chips are selected to form the multi-story structure and thereby enhanced yield may be obtained.

Referring back to FIG. 1H, the single block 911 may have a face-to-face structure F-F in which the chip-level first semiconductor chip 100a is directly bonded to the chip-level second semiconductor chip 200a. This structural feature will be described below in detail with reference to FIG. 2A enlargedly showing a portion 500 of FIG. 1H.

Referring to FIGS. 1H and 2A, the first circuit layer 113 may comprise an integrated circuit 103 formed on the front surface 111a of the first semiconductor substrate 111, single-layered or multi-layered metal lines 107 electrically connecting the integrated circuit 103 to the first through-electrodes 115 and/or the first front pads 117, an interlayer dielectric layer 105 covering the integrated circuit 103 and the metal lines 107, and an upper insulating layer 106 which is provided on the interlayer dielectric layer 105 and is capable of preventing or reducing a likelihood of a constituent (e.g., copper) of the first front pad 117 from being diffused.

The interlayer dielectric layer 105 may be formed by depositing TEOS (tetraethyl orthosilicate) or silicon oxide (SiOx). The upper insulating layer 106 may be formed by depositing SiN, SiON, SiCN, AlN, etc.

The first front pad 117 may be formed by a damascene process such that a top surface of the first front pad 117 may not protrude over the upper insulating layer 106. For example, the top surface of the first front pad 117 may be coplanar with a top surface of the upper insulating layer 106. A via insulating layer 101 may surround the first through-electrode 115, such that the first through-electrode 115 may be electrically insulated from the first semiconductor substrate 111. The first through-electrode 115 may be formed by a via last or via first scheme. Therefore, the first through-electrode 115 may be confined in the first semiconductor substrate 111.

The second circuit layer 213 may have a structural feature substantially identical or similar to that of the first circuit layer 113. For example, the second circuit layer 213 may comprise an integrated circuit 203 formed on the front surface 211a of the second semiconductor substrate 211, single-layered or multi-layered metal lines 207 electrically connecting the integrated circuit 203 to the second through-electrode 215 and/or the second front pad 217, an interlayer dielectric layer 205 covering the integrated circuit 203 and the metal lines 207, and an upper insulating layer 206, which is provided on the interlayer dielectric layer 205 and is capable of preventing or reducing a likelihood of a constituent (e.g., copper) of the second front pad 217 from being diffused. The interlayer dielectric layer 205 may be formed by depositing TEOS (tetraethyl orthosilicate) or silicon oxide (SiOx). The upper insulating layer 206 may be formed by depositing SiN, SiON, SiCN, AlN, and so forth.

The second front pad 217 may be formed by a damascene process such that a top surface of the second front pad 217 may be coplanar with a top surface of the upper insulating layer 206. The second through-electrode 215 may be formed by a via last or via first scheme. Therefore, the second through-electrode 215 may be confined in the second semiconductor substrate 211. A via insulating layer 201 may surround the second through-electrode 215 to electrically insulate the second through-electrode 215 from the second semiconductor substrate 211.

In the single block 911, the first circuit layer 113 of the chip-level first semiconductor chip 100a may face the second circuit layer 213 of the chip-level second semiconductor chip 200a. Accordingly, the single block 911 may have a face-to-face structure F-F in which the front surface 111a of the first semiconductor substrate 111 faces the front surface 211a of the second semiconductor substrate 211.

The first and second semiconductor chips 100a and 200a may be bonded to each other under a high temperature condition, and optionally with high pressure while the first circuit layer 113 faces the second circuit layer 213 as described with reference to FIG. 1B. Consequently, the upper insulating layer 106 of the first semiconductor chip 100a may be firmly combined with the upper insulating layer 206 of the second semiconductor chip 200a.

In the case that the first and second front pads 117 and 217 are formed of copper, the first front pad 117 may be rigidly and directly coupled to the second front pad 217 by mutual diffusion of copper. As such, the first and second semiconductor chips 100a and 200a may be directly bonded to each other without interconnection members such as solder balls or solder bumps.

Alternatively, the first through-electrode 115 may be formed by a via middle scheme. Therefore, the first through-electrode 115 may protrude over the front surface 111a of the first semiconductor substrate 111 to further partially penetrate the interlayer dielectric layer 105, as shown in FIG. 2B. Identically or similarly, the second through-electrode 215 may be formed by a via middle scheme. Therefore, the second through-electrode 215 may protrude over the front surface 211a of the second semiconductor substrate 211 to further partially penetrate the interlayer dielectric layer 205.

Referring to FIG. 1I, a plurality of single blocks 911 may be stacked one atop the other. For example, two single blocks 911 may be stacked to form a double block 912. The single blocks 911 may be spaced apart from each other and terminals 219 may be interposed to electrically connect the single blocks 911 each other.

The double block 912 may have a hybrid structure. For example, a face-to-face structure F-F may be present at each of the single blocks 911 and a back-to-back structure B-B may be present between the single blocks 911. Another double block 912 may be further stacked on the double block 912 to constitute an eight-story stacking structure.

Figure 3A:
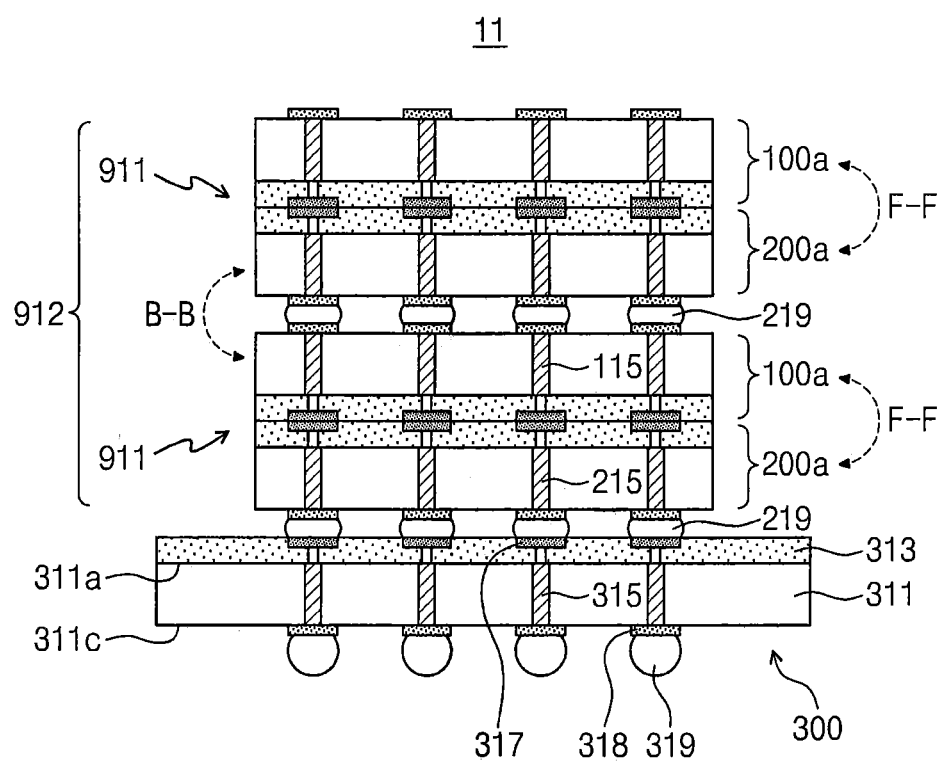
FIGS. 3A and 3B are cross-sectional views illustrating a method for fabricating a semiconductor device according to an exemplary embodiment of the present inventive concept.
Figure 3B:
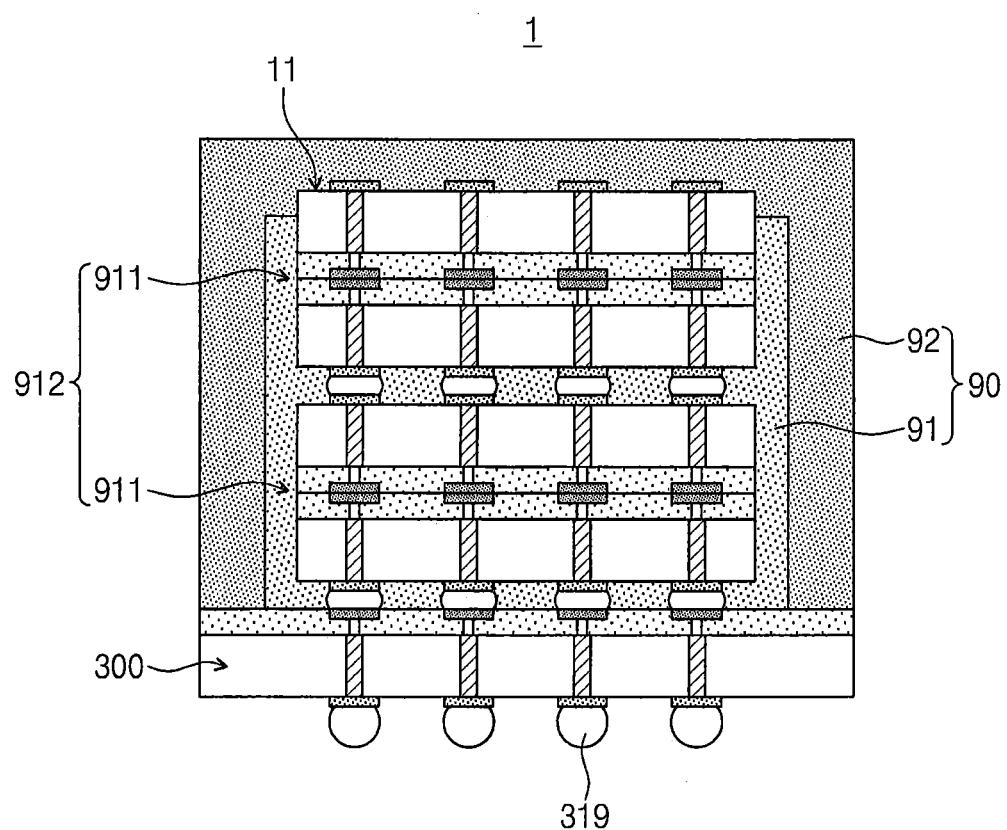

FIGS. 3A and 3B are cross-sectional views illustrating a method for fabricating a semiconductor device according to an exemplary embodiment of the present inventive concept.

Referring to FIG. 3A, the double block 912 may be formed by processes substantially identical or similar to those as described with reference to FIGS. 1A to 1I, and the double block 912 may be mounted on a chip-level third semiconductor chip 300 to form a stacked chip 11. The third semiconductor chip 300 may have a structural feature substantially identical or similar to that of one of the first and second semiconductor chips 100a and 200a.

Alternatively, the single block 911 may be mounted on the third semiconductor chip 300 to form the stacked chip 11. In other embodiments, the double block 912 or the single block 911 may be mounted on a printed circuit board to form the stacked chip 11.

The third semiconductor chip 300 may comprise a third semiconductor substrate 311 including a front surface 311a as an active surface and a backside surface 311c as an inactive surface, a third circuit layer 313 including an integrated circuit and a third front pad 317 on the front surface 311a of the third semiconductor substrate 311, and at least one third through-electrode 315 penetrating the third semiconductor substrate 311 to be electrically connected to the third circuit layer 313.

The third front pad 317 may include a metal, such as copper, aluminum, or an alloy thereof. The third through-electrode 315 may be vertically aligned with the first and second through-electrodes 115 and 215 of the single block 911. Therefore, the third through-electrode 315 may not be provided at lateral edges of the third semiconductor chip 300.

The third semiconductor chip 300 may further comprise a third backside pad 318 that is provided on the backside surface 311c of the third semiconductor substrate 311 and is electrically connected to the third through-electrode 315, and an outer terminal 319 coupled to the third backside pad 318. The third backside pad 318 may include a metal, such as copper, aluminum, or an alloy thereof.

The third semiconductor chip 300 may have a size greater than that of the double block 912. The third semiconductor chip 300 may be electrically connected to the double block 912 by a plurality of terminals 219.

Referring to FIG. 3B, a mold layer 90 may be formed on the third semiconductor chip 300 to encapsulate the stacked chip 11 and thereby a semiconductor package 11 may be fabricated. The mold layer 90 may have a single layer or a multiple layer. For example, the mold layer 90 may comprise an inner mold layer 91 serving as an underfill layer and an outer mold layer 92 covering the inner mold layer 91. The inner mold layer 91 may fill a space between the single blocks 911 and a space between the double block 912 and the third semiconductor chip 300.

Figure 4A:
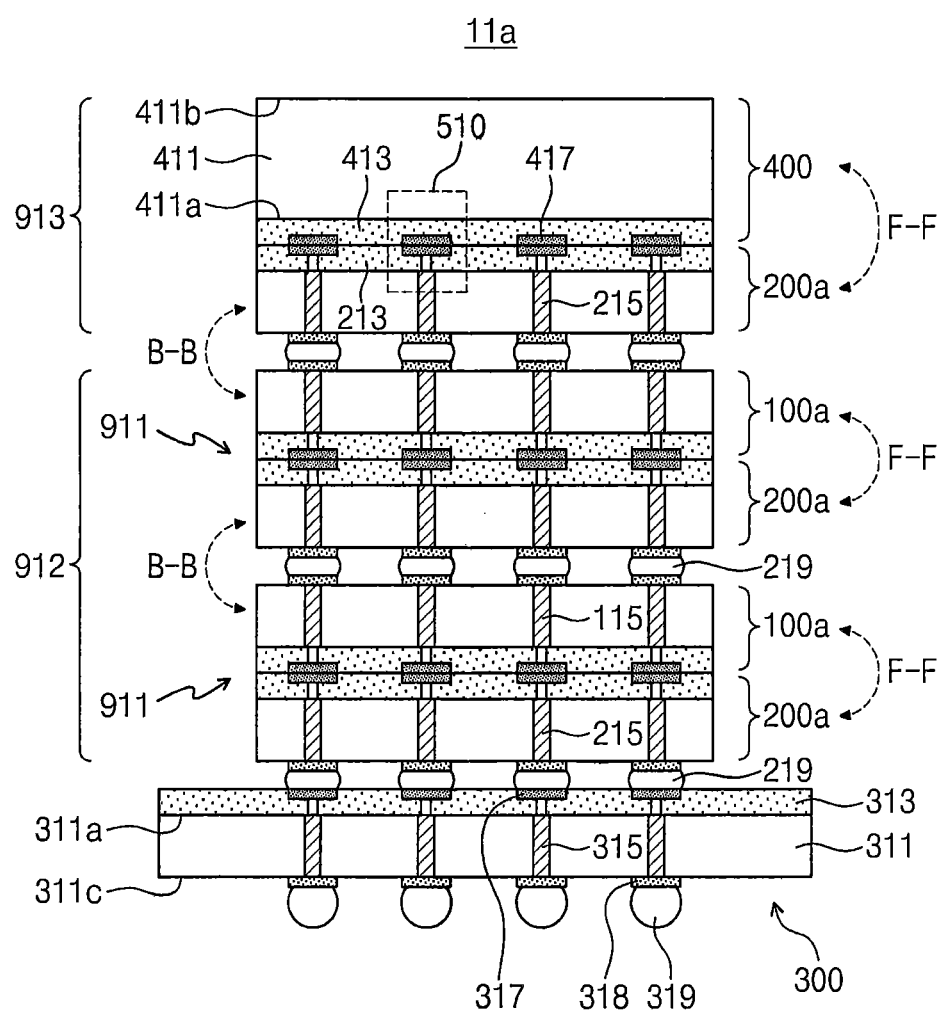
FIGS. 4A and 4B are cross-sectional views illustrating a method for fabricating a semiconductor device according to an exemplary embodiment of the present inventive concept.
Figure 4B:
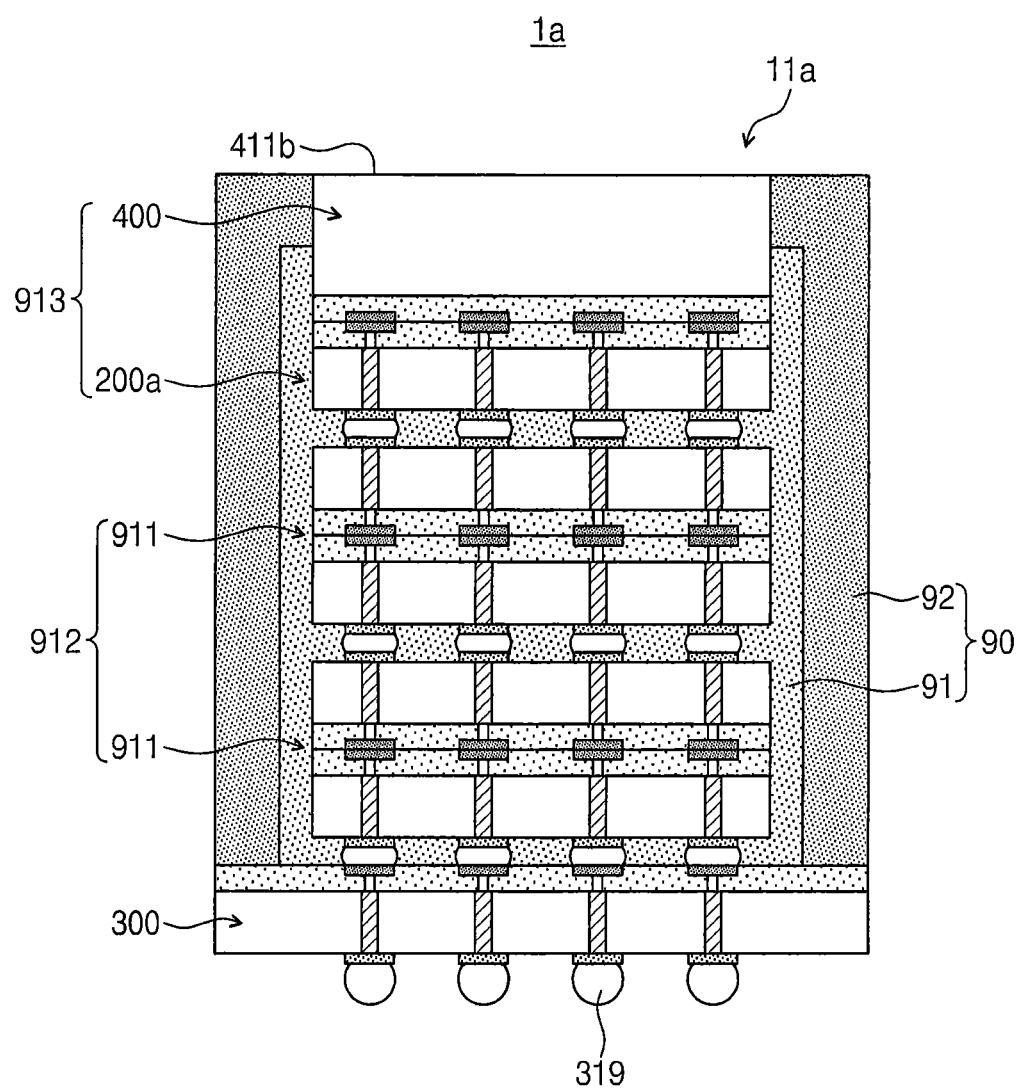

FIGS. 4A and 4B are cross-sectional views illustrating a method for fabricating a semiconductor device according to an exemplary embodiment of the present inventive concept.

Referring to FIG. 4A, the double block 912 may be formed by processes substantially identical or similar to those as described with reference to FIGS. 1A to 1I, and the double block 912 may be mounted on the chip-level third semiconductor chip 300. After or before mounting the double block 912 on the third semiconductor chip 300, a single block 913 may be stacked on the double block 912 to form a stacked chip 11a. The single block 913 may comprise the second semiconductor chip 200a and a fourth semiconductor chip 400 stacked thereon. Alternatively, the stacked chip 11a may comprise the single block 913 and only one single block 911 sequentially mounted on the third semiconductor chip 300.

The fourth semiconductor chip 400 may comprise a fourth semiconductor substrate 411 including a front surface 411a as an active surface and a backside surface 411b as an inactive surface, and a fourth circuit layer 413 including an integrated circuit and a fourth front pad 417 provided on the front surface 411a of the fourth semiconductor substrate 411. The integrated circuit included in the fourth semiconductor chip 400 may be a memory circuit, a logic circuit, or a combination thereof. The backside surface 411b of the fourth semiconductor substrate 411 may not be grinded down. Consequently, the fourth semiconductor chip 400 may have a thickness greater than that of at least the first and second semiconductor chips 100a and 200a.

In the single block 913, the second semiconductor chip 200a may be directly coupled to the fourth semiconductor chip 400 to constitute a face-to-face structure F-F. The double block 912 and the single block 913 may constitute a back-to-back structure B-B.

In the single block 913, a combinational configuration between the second circuit layer 213 and the fourth circuit layer 413 may have a structural feature substantially identical or similar to that of FIG. 2A or 2B except that the fourth semiconductor chip 400 may have no through electrodes.

Referring to FIG. 4B, the mold layer 90 may be formed on the third semiconductor chip 300 to encapsulate the stacked chip 11a and thereby a semiconductor package 1a may be fabricated. The mold layer 90 may be a multiple layer including the inner mold layer 91 serving as an underfill layer and the outer mold layer 92 covering the inner mold layer 91. The backside surface 411b of the fourth semiconductor chip 400 may not be covered with the outer mold layer 92. Alternatively, the backside surface 411b of the fourth semiconductor chip 400 may be covered with the outer mold layer 92.

FIGS. 5A to 5D are cross-sectional views illustrating a method for fabricating a semiconductor device according to an exemplary embodiment of the present inventive concept. FIG. 5E is a cross-sectional view of another example of FIG. 5D. FIG. 5F is an enlarged cross-sectional view of a portion of FIG. 5D.

Figure 5A:
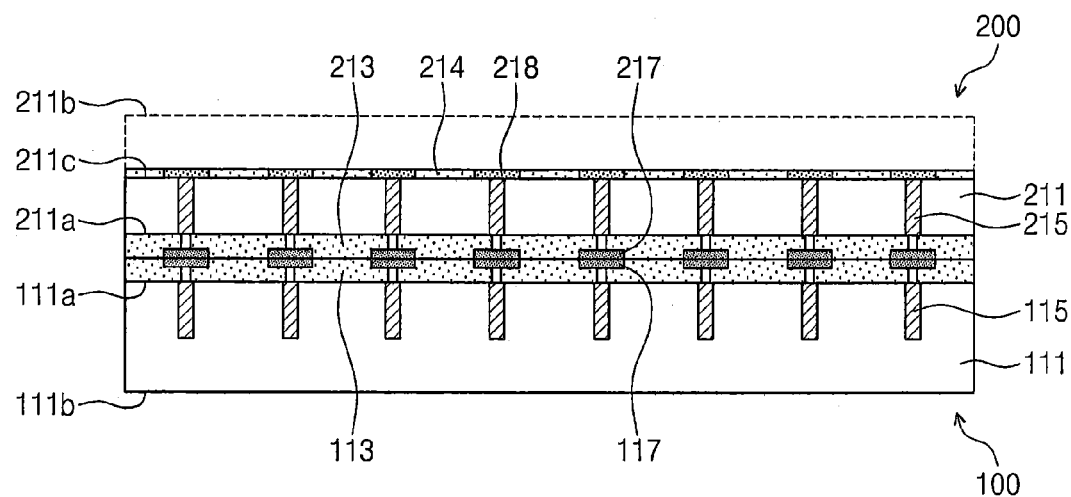
FIGS. 5A to 5D are cross-sectional views illustrating a method for fabricating a semiconductor device according to an exemplary embodiment of the present inventive concept.

Referring to FIG. 5A, the wafer-level first and second semiconductor chips 100 and 200 may be bonded to have a face-to-face structure F-F by processes substantially identical or similar to those as described with reference to FIGS. 1A to 1C, and the backside surface 211b of the second semiconductor substrate 211 may be grinded down without a carrier to thin the second semiconductor chip 200. The thinning of the second semiconductor chip 200 may reveal the recessed second surface 211c of the second semiconductor substrate 211.

After the stacking process, the first and second semiconductor chips 100 and 200 may be bonded to each other under a high temperature condition, and optionally with high pressure. Alternatively, the stacking and bondage processes may be performed simultaneously at high temperature, and optionally with high pressure.

A second backside insulating layer 214 may be formed to cover the second backside surface 211c of the second semiconductor substrate 211, and the second backside pad 218 may be formed to be electrically connected to the second through-electrode 215. In an exemplary embodiment, the second backside pad 218 may be formed by a damascene process. Therefore, the second backside pad 218 may not protrude over the second backside insulating layer 214. For example, a surface of the second backside pad 218 may be coplanar with a surface of the second backside insulating layer 214. The second backside pad 218 may include copper.

Prior to the formation of the second backside insulating layer 214, an insulating layer may be further formed to electrically insulate the second backside pad 218 from the second semiconductor substrate 211, as illustrated in FIG. 1D.

Figure 5B:
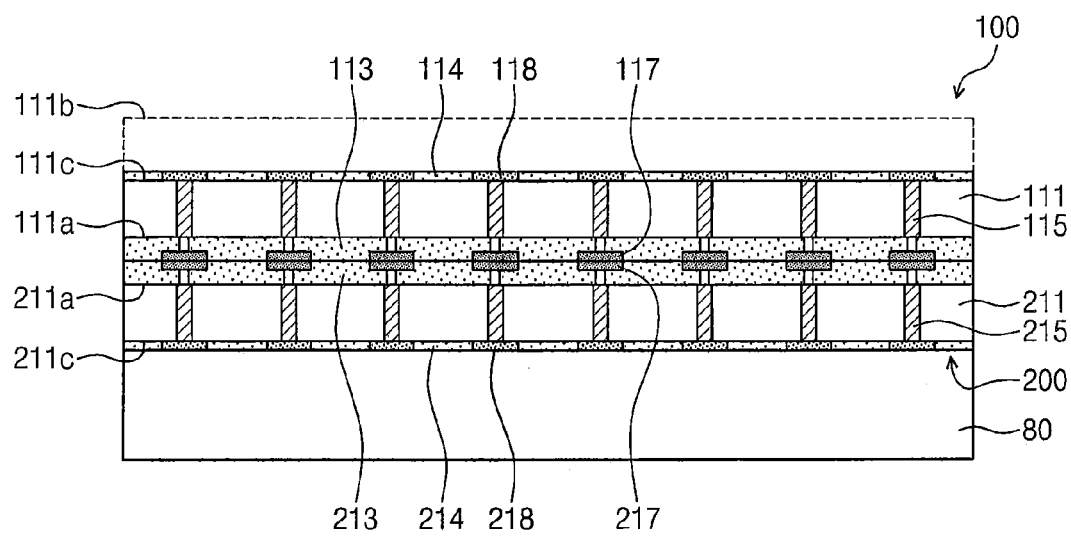

Referring to FIG. 5B, the carrier 80 may adhere to the second backside insulating layer 214 by processes substantially identical or similar to those as described with reference to FIGS. 1E and 1F, and the backside surface 111b of the first semiconductor substrate 111 may be grinded down to thin the first semiconductor chip 100. The thinning of the first semiconductor chip 100 may reveal the second backside surface 111c of the first semiconductor substrate 111.

A first backside insulating layer 114 may be formed to cover the second backside surface 111c of the first semiconductor substrate 111, and the first backside pad 118 may be formed to be electrically connected to the first through-electrode 115. In an exemplary embodiment, the first backside pad 118 may be formed by a damascene process. Therefore, the first backside pad 118 may not protrude over the first backside insulating layer 114. For example, a surface of the first backside pad 118 may be coplanar with a surface of the first backside insulating layer 114. The first backside pad 118 may include copper.

Prior to the formation of the first backside insulating layer 114, an insulating layer may be further formed to electrically insulate the first backside pad 118 from the first semiconductor substrate 111, as illustrated in FIG. 1E.

Figure 5C:
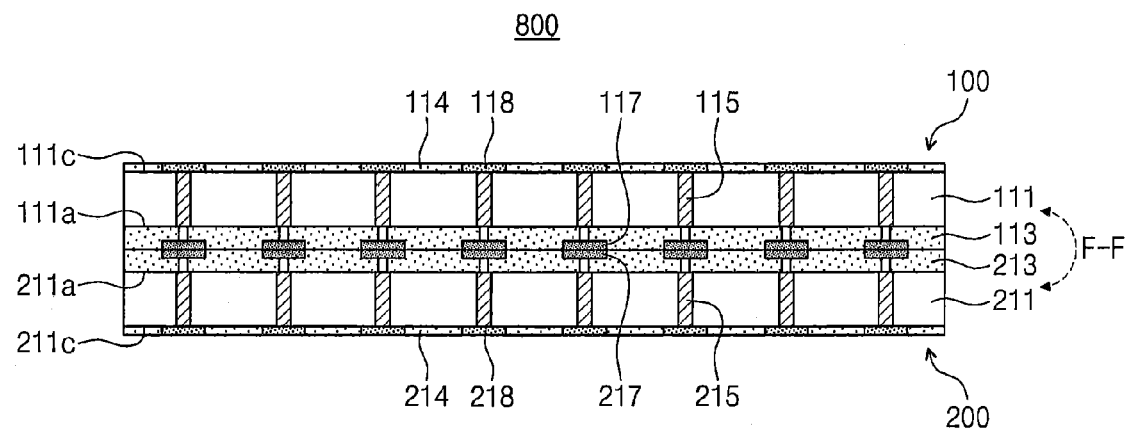

Referring to FIG. 5C, the aforementioned processes may fabricate a wafer-level chip stack 800 comprising the second semiconductor chip 200 including the second through-electrodes 215 stacked on the first semiconductor chip 100 including the first through-electrodes 115. In an exemplary embodiment, the first and second semiconductor chips 100 and 200 are grinded down such that the thickness of the chip stack 800 may be reduced. The chip stack 800 may have a face-to-face structure F-F in which the first and second semiconductor chips 100 and 200 are bonded to each other in such a way that the first circuit layer 113 faces the second circuit layer 213.

Figure 5D:
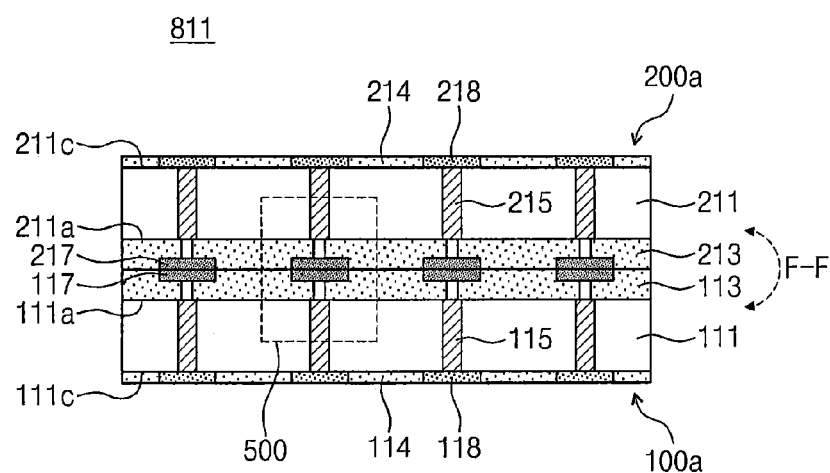
Figure 5E:
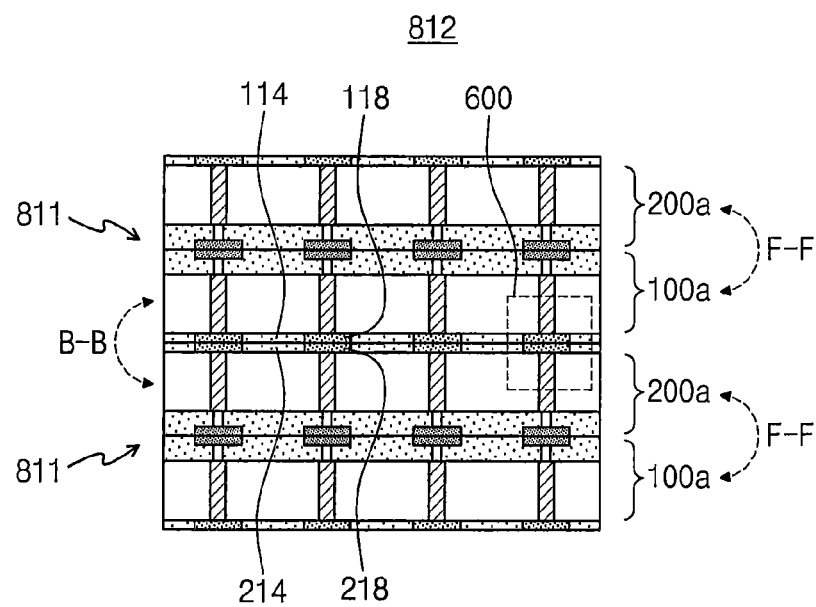
FIG. 5E is a cross-sectional view of another example of FIG. 5D.
Figure 5F:
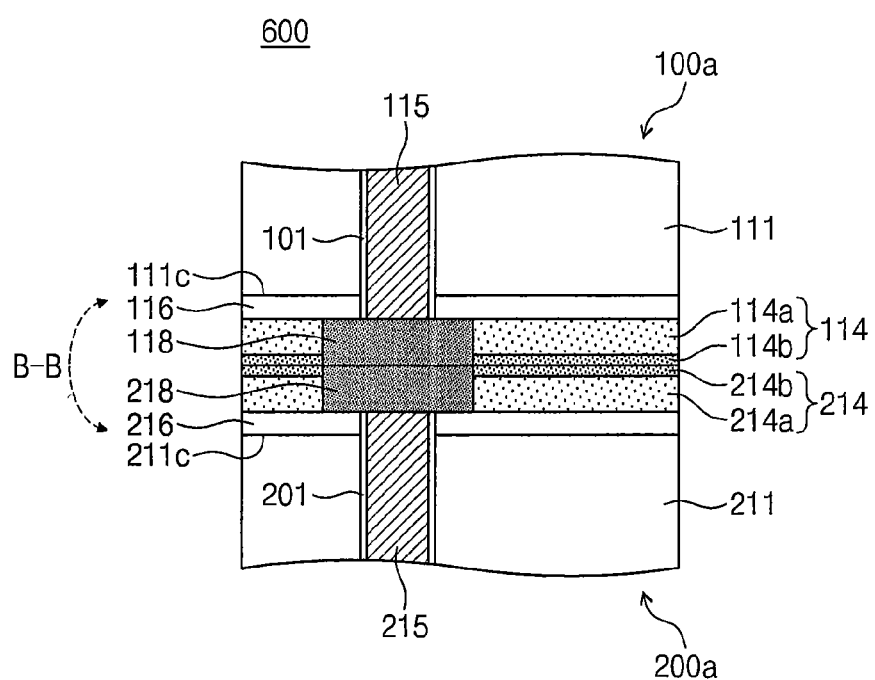
FIG. 5F is an enlarged cross-sectional view of a portion of FIG. 5D.

Referring to FIG. 5D, the wafer-level chip stack 800 may be divided into a plurality of single blocks 811 each having a chip-level stacked structure. The single block 811 may have a face-to-face structure F-F in which the chip-level first semiconductor chip 100a is directly coupled to the chip-level second semiconductor chip 200a. A portion 500 of the single block 811 may show a combinational configuration between the first circuit layer 113 and the second circuit layer 213 substantially identical or similar to that of FIG. 2A or 2B.

Referring to FIG. 5E, a plurality of single blocks 811 may be stacked one atop the other. For example, two single blocks 811 may be stacked to form a double block 812. After the stacking process, the single blocks 811 may be bonded to each other under a high temperature condition, and optionally with high pressure. Alternatively, the stacking and bondage processes may be performed simultaneously at high temperature, and optionally with high pressure.

The double block 812 may have a hybrid structure. For example, a face-to-face structure F-F may be present at each of the single blocks 811 and a back-to-back structure B-B may be present between the single blocks 811. For example, the first backside insulating layer 114 may directly contact the second backside insulating layer 214, such that the first and second semiconductor chips 100a and 200a may be bonded to each other. This will be described below in detail with reference to FIG. 5F enlargedly showing a portion 600 of FIG. 5E.

Referring to FIGS. 5E and 5F, the first backside insulating layer 114 of the single block 811 may face the second backside insulating layer 214 of another single block 811. Consequently, the single blocks 811 may be stacked to have a back-to-back structure B-B. The insulating layer 116 may be further formed between the first backside insulating layer 114 and the first semiconductor substrate 111 to electrically insulate the first backside pad 118 from the first semiconductor substrate 111. Likewise, the insulating layer 216 may be further formed between the second backside insulating layer 214 and the second semiconductor substrate 211 to electrically insulate the second backside pad 218 from the second semiconductor substrate 211.

The single blocks 811 may be bonded to each other under a high temperature condition, and optionally with high pressure while the first backside insulating layer 114 faces the second backside insulating layer 214. Therefore, the first backside insulting layer 114 may be rigidly and directly coupled to the second backside insulating layer 214. In other words, the single blocks 811 may be bonded to each other without an interval therebetween.

In case that the first and second backside pads 118 and 218 are formed of copper, the first backside pad 118 may be directly coupled to the second backside pad 218 by mutual diffusion of copper. As such, single blocks 811 may be directly bonded to each other without interconnection members such as solder balls or solder bumps.

At least one of the first and second backside insulating layers 114 and 214 may have a multi-layered structure. For example, the first backside layer 114 may be a multi-layered structure including a first insulating layer 114a, which is formed by depositing TEOS or SiOx and a second insulating layer 114b which is formed by depositing material (e.g., SiN, SiON, SiCN, AlN) capable of preventing or reducing the likelihood of diffusion of a constituent (e.g., copper) of the first backside pad 118.

Similarly, the second backside insulating layer 214 may be a multi-layered structure including a first insulating layer 214a, which is formed by depositing TEOS or SiOx and a second insulating layer 214b which is formed by depositing material (e.g., SiN, SiON, SiCN, AlN) capable of preventing or reducing the likelihood of diffusion of a constituent (e.g., copper) of the second backside pad 218.

Alternatively, the first and second backside layer 114 and 214 may be a single-layered structure formed by depositing SiOx, SiN, SiON, SiCN, AlN and so forth.

Figure 6A:
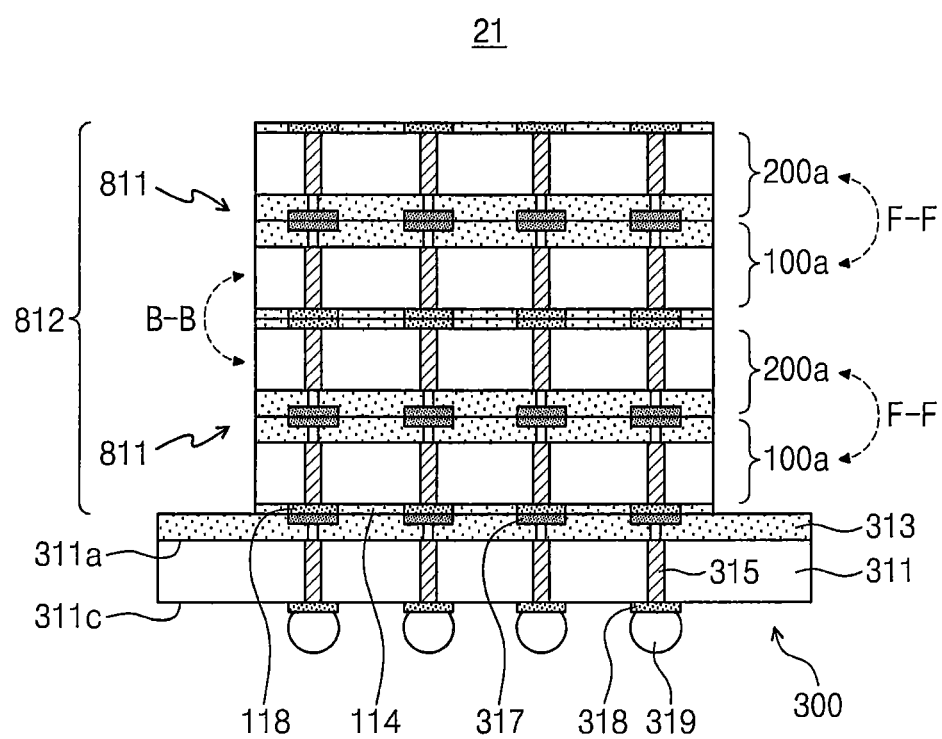
FIGS. 6A and 6B are cross-sectional views illustrating a method for fabricating a semiconductor device according to an exemplary embodiment of the present inventive concept.
Figure 6B:
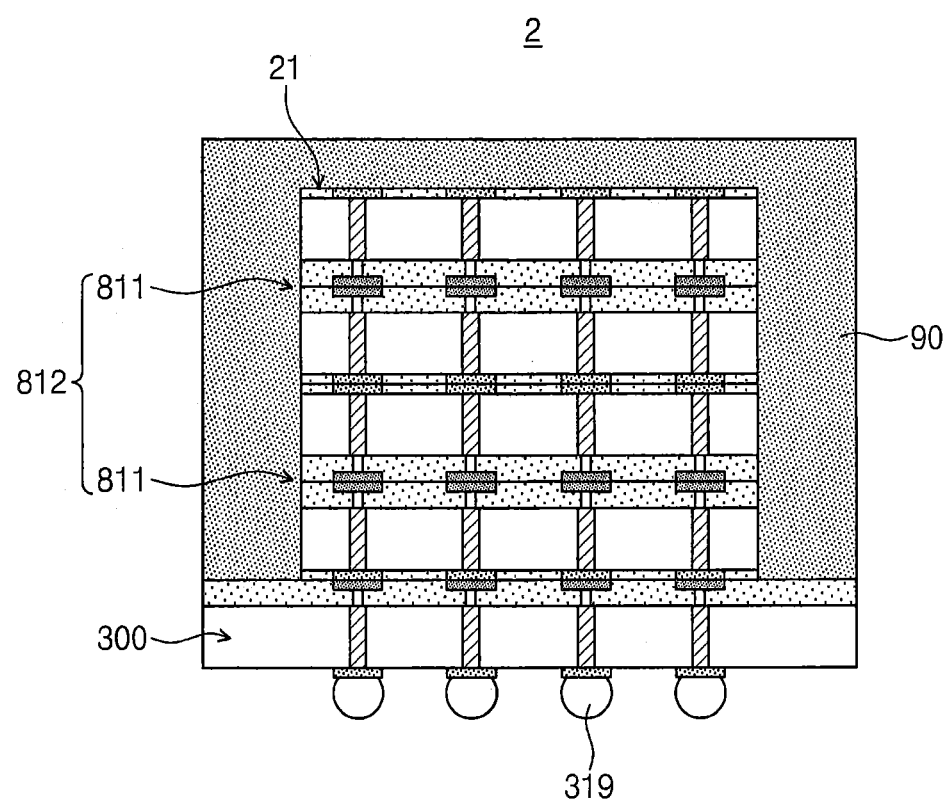

FIGS. 6A and 6B are cross-sectional views illustrating a method for fabricating a semiconductor device according to an exemplary embodiment of the present inventive concept.

Referring to FIG. 6A, a double block 812 may be formed by processes substantially identical or similar to those as described with reference to FIGS. 5A to 5E, and the double block 812 may be mounted on the third semiconductor chip 300 to form a stacked chip 21. The third semiconductor chip 300 may have a structural feature substantially identical or similar to that of one of the first and second semiconductor chips 100a and 200a.

Alternatively, the single block 811 may be mounted on the third semiconductor chip 300 to form the stacked chip 21. Differently, the double block 812 or the single block 811 may be mounted on a printed circuit board to form the stacked chip 21.

The third semiconductor chip 300 may comprise a third semiconductor substrate 311 including a front surface 311a as an active surface and a backside surface 311c as an inactive surface, a third circuit layer 313 including an integrated circuit and a third front pad 317 on the front surface 311a of the third semiconductor substrate 311, and at least one third through-electrode 315 penetrating the third semiconductor substrate 311 to be electrically connected to the third circuit layer 313. The third front pad 317 may include a metal, such as copper, aluminum, or an alloy thereof. The third front pad 317 may include copper formed by a damascene process and may not protrude over the first circuit layer 313.

The third semiconductor chip 300 may further comprise a third backside pad 318 that is provided on the backside surface 311c of the third semiconductor substrate 311 and is electrically connected to the third through-electrode 315, and an outer terminal 319 coupled to the third backside pad 318. The integrated circuit included in the third semiconductor chip 300 may be a memory circuit, a logic circuit, or a combination thereof. The third backside pad 318 may include a metal, such as copper, aluminum, or an alloy thereof.

The third semiconductor chip 300 may have a size greater than that of the double block 812. The third circuit layer 313 may directly contact the first backside insulating layer 114, such that the third semiconductor chip 300 may be coupled to the double block 812. In the case that the third front pad 317 and the first backside pad 118 are formed of copper, the third front pad 317 may be directly coupled to the first backside pad 118 by mutual diffusion of copper.

Referring to FIG. 6B, a mold layer 90 may be formed on the third semiconductor chip 300 to encapsulate the stacked chip 21 and thereby a semiconductor package 2 may be fabricated. The mold layer 90 may have a single-layered structure.

Figure 7A:
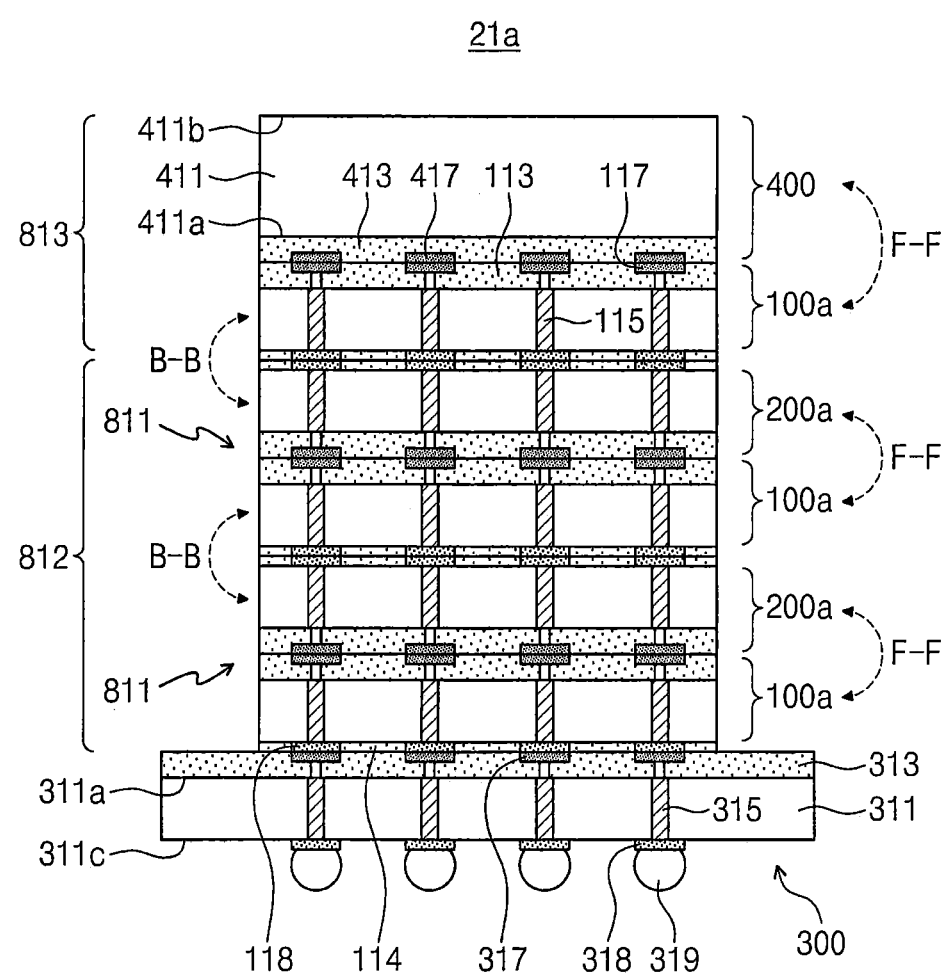
FIGS. 7A and 7B are cross-sectional views illustrating a method for fabricating a semiconductor device according to an exemplary embodiment of the present inventive concept.
Figure 7B:
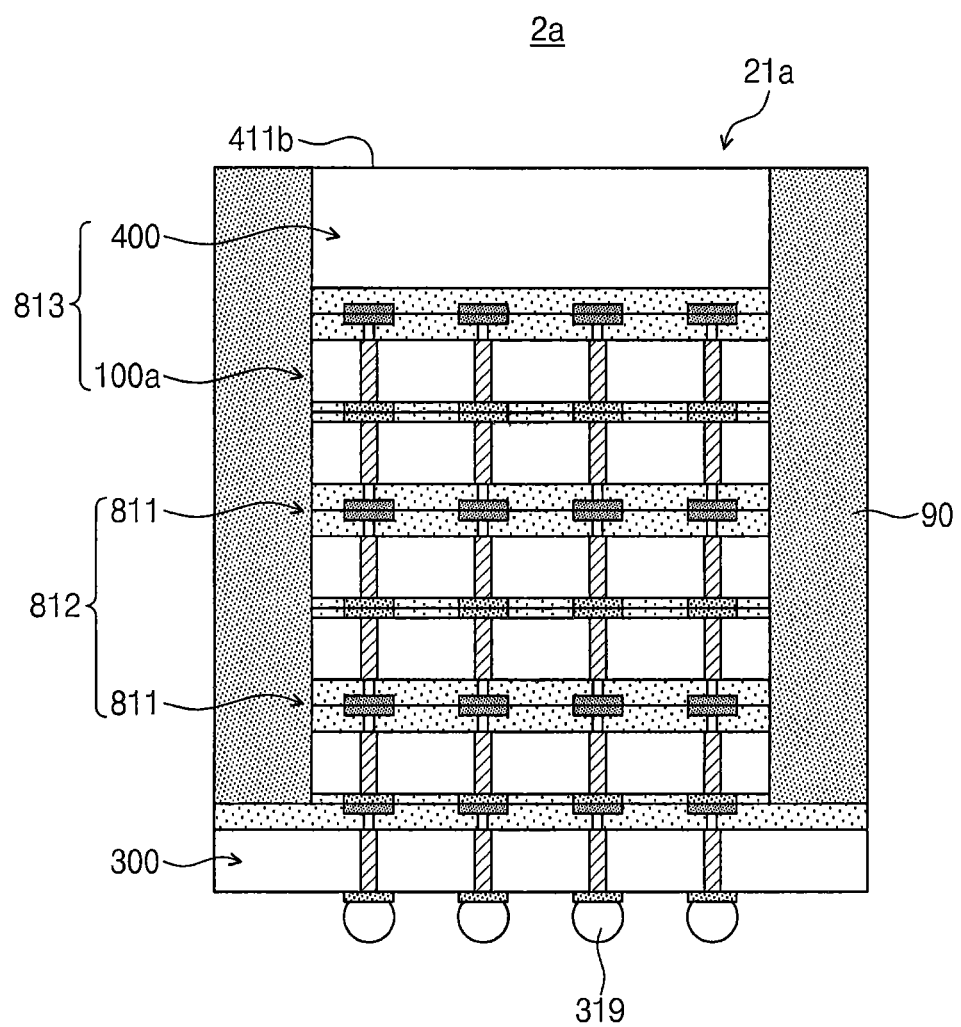

FIGS. 7A and 7B are cross-sectional views illustrating a method for fabricating a semiconductor device according to an exemplary embodiment of the present inventive concept.

Referring to FIG. 7A, a double block 812 may be formed by processes substantially identical or similar to those as described with reference to FIGS. 5A to 5E, and the double block 812 may be mounted on the chip-level third semiconductor chip 300. After or before mounting the double block 812 on the third semiconductor chip 300, a single block 813 may be stacked on the double block 812 to form a stacked chip 21a. The single block 813 may comprise the first semiconductor chip 100a and a fourth semiconductor chip 400 stacked thereon. Alternatively, the stacked chip 21a may comprise the single block 813 and the only one single block 811 sequentially stacked on the third semiconductor chip 300.

The fourth semiconductor chip 400 may comprise a fourth semiconductor substrate 411 including a front surface 411a as an active surface and a backside surface 411b as an inactive surface, and a fourth circuit layer 413 including an integrated circuit and a fourth front pad 417 provided on the front surface 411a of the fourth semiconductor substrate 411. The integrated circuit included in the fourth semiconductor chip 400 may be a memory circuit, a logic circuit, or a combination thereof. The backside surface 411b of the fourth semiconductor substrate 411 may not be grinded down. Consequently, the fourth semiconductor chip 400 may have a thickness greater than that of at least the first and second semiconductor chips 100a and 200a.

In the single block 813, the first semiconductor chip 100a may be directly coupled to the fourth semiconductor chip 400 to constitute a face-to-face structure F-F. For example, the fourth semiconductor chip 400 may be stacked on the first semiconductor chip 100a, such that the first circuit layer 113 may face the fourth circuit layer 413. The double block 812 and the single block 813 may constitute a back-to-back structure B-B.

Referring to FIG. 7B, a mold layer 90 may be formed on the third semiconductor chip 300 to encapsulate the stacked chip 21a and thereby a semiconductor package 2a may be fabricated. The mold layer 90 may be a single-layered structure. The backside surface 411b of the fourth semiconductor chip 400 may not be covered with the mold layer 90. Alternatively, the backside surface 411b of the fourth semiconductor chip 400 may be covered with the mold layer 90.

Figure 8A:
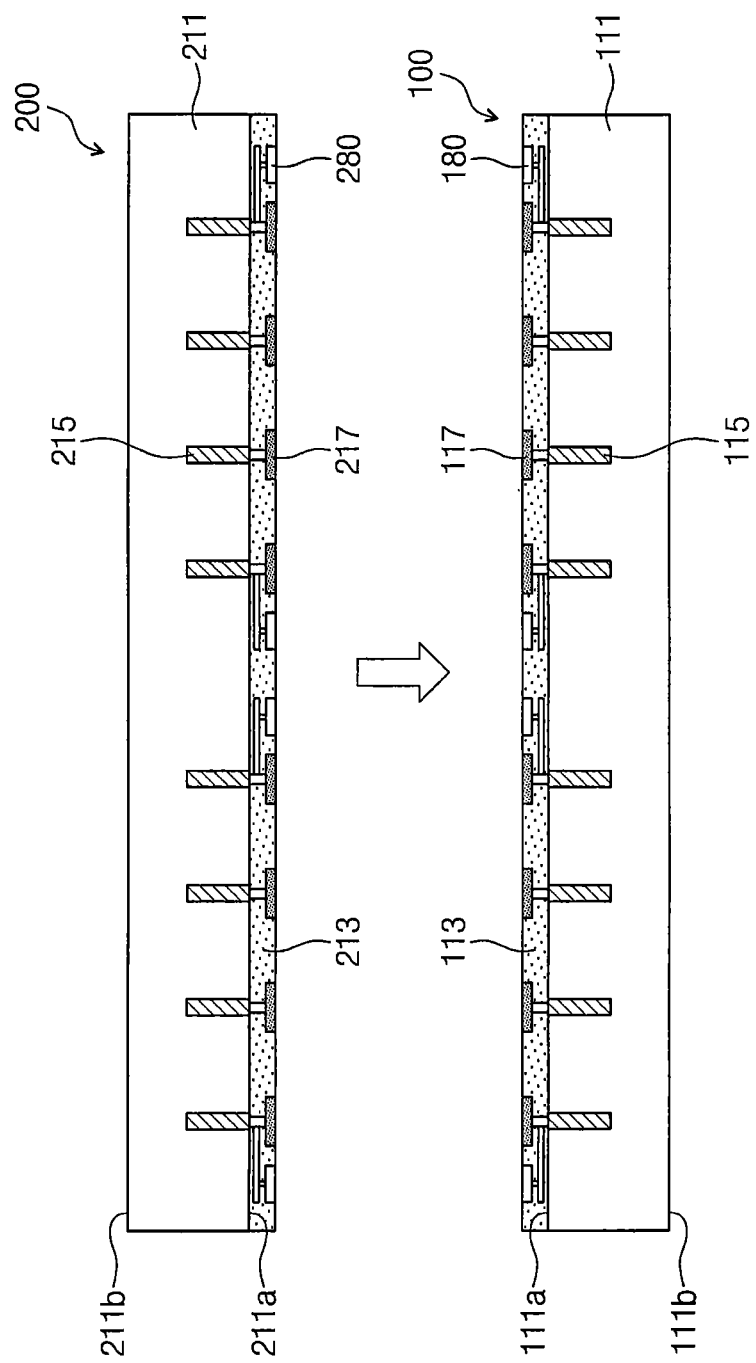
FIGS. 8A to 8C cross-sectional views illustrating a method for fabricating a semiconductor device according to an exemplary embodiment of the present inventive concept.
Figure 8B:
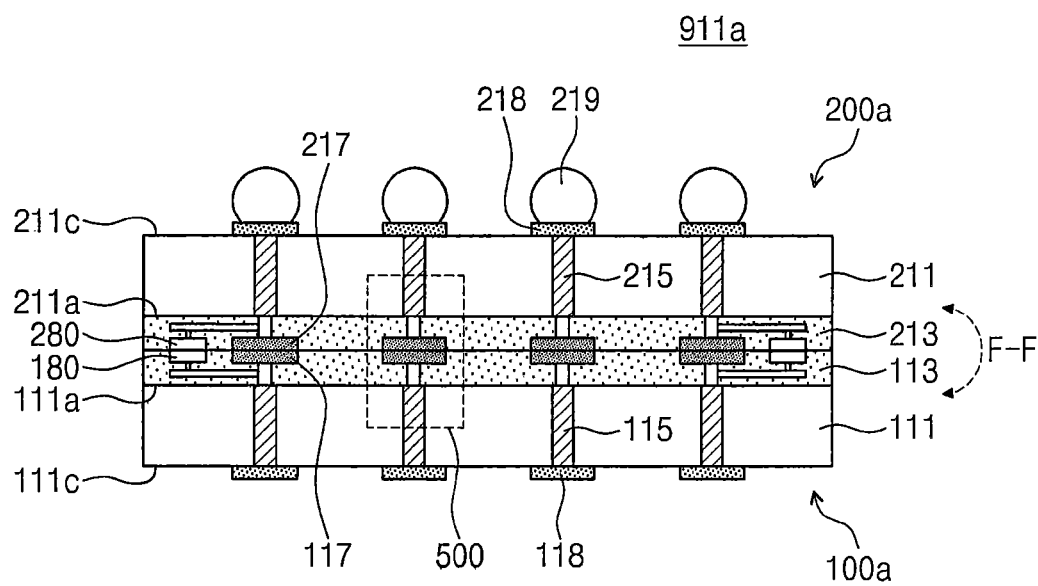
Figure 8C:
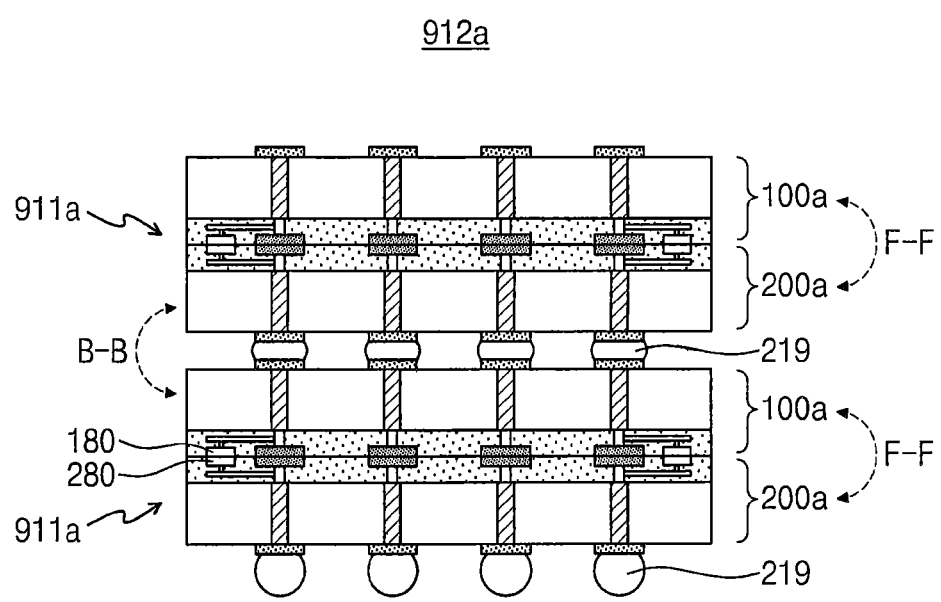

FIGS. 8A to 8C are cross-sectional views illustrating a method for fabricating a semiconductor device according to an exemplary embodiment of the present inventive concept.

Referring to FIG. 8A, the wafer-level first and second semiconductor chips 100 and 200 may be bonded to have a face-to-face structure F-F by processes substantially identical or similar to those as described with reference to FIGS. 1A and 1B. The first semiconductor chip 100 may further comprise at least one first test pad 180 electrically connected to the first through-electrode 115. Similarly, the second semiconductor chip 200 may further comprise at least one second test pad 280 electrically connected to the second through-electrode 215.

Referring to FIG. 8B, a single block 911*a* may be formed to include the chip-level first and second semiconductor chips 100*a* and 200*a* that are stacked to have a face-to-face structure F-F by processes substantially identical or similar to those as described with reference to FIGS. 1C to 1H. The single block 911*a* may comprise a portion 500 whose structural feature is substantially identical or similar to that of FIG. 2A or 2B. For example, the first test pad 180 may directly contact the second test pad 280.

In an exemplary embodiment, as shown in FIG. 8A, prior to bonding the wafer-level first semiconductor chip 100 to the wafer-level second semiconductor chip 200 (i.e., wafer bonding process), an electrical test may be performed on the first and second semiconductor chips 100 and 200. For example, a probe may contact the first test pad 180 to determine whether the first semiconductor chip 100 is a good chip prior to the wafer bonding process. Likewise, a probe may contact the second test pad 280 to determine whether the second semiconductor chip 200 is a good chip prior to the wafer bonding process.

Differently from the present exemplary embodiment, in the case that the first semiconductor chip 100 may have no test pad 180, a probe may contact the first front pad 117 to determine whether the first semiconductor chip 100 is a good chip. When the probe comes into direct contact with the first front pad 117, the first front pad 117 may suffer from scratches or damage. Likewise, the second front pad 217 may undergo scratches or damage owing to the direct contact of probe.

Scratches or damage may have a bad effect on a good contact between the first front pad 117 and the second front pad 217. In an exemplary embodiment, a probe contacts the first and second test pads 180 and 280 and thereby prevents or reduces damage or scratches to the first and second front pads 117 and 217. Moreover, the wafer bonding process may be performed after the electrical test of the first and second semiconductor chips 100 and 200.

Referring to FIG. 8C, a plurality of single blocks 911*a* may be stacked one atop the other to form a double block 912*a* having a hybrid structure. For example, a face-to-face structure F-F may be present at each of the single blocks 911*a* and a back-to-back structure B-B may be present between the single blocks 911*a*.

The single block 911*a* or the double block 912*a* may be mounted on the third semiconductor chip 300 or the printed circuit board so as to fabricate a semiconductor package as illustrated in FIG. 3B or 4B.

Figure 9A:
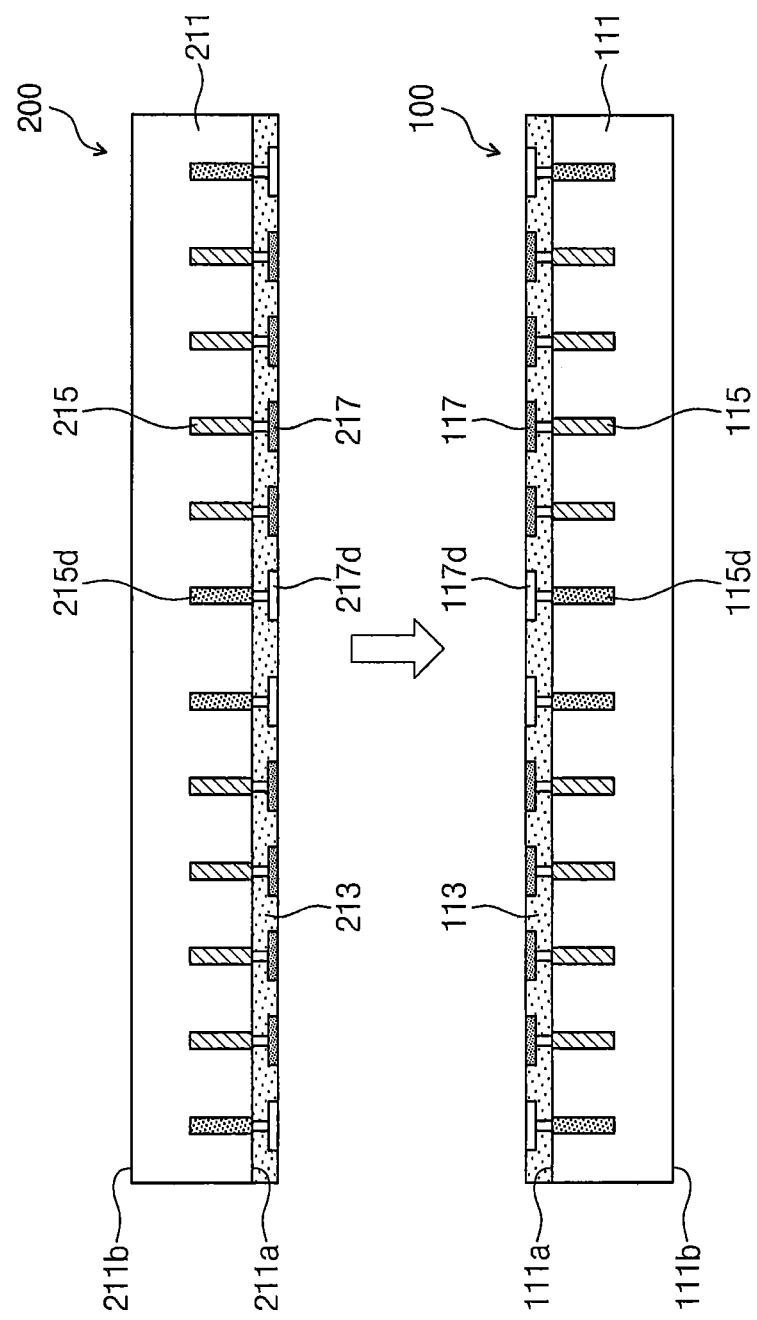
FIGS. 9A to 9C are cross-sectional views illustrating a method for fabricating a semiconductor device according to an exemplary embodiment of the present inventive concept.
Figure 9B:
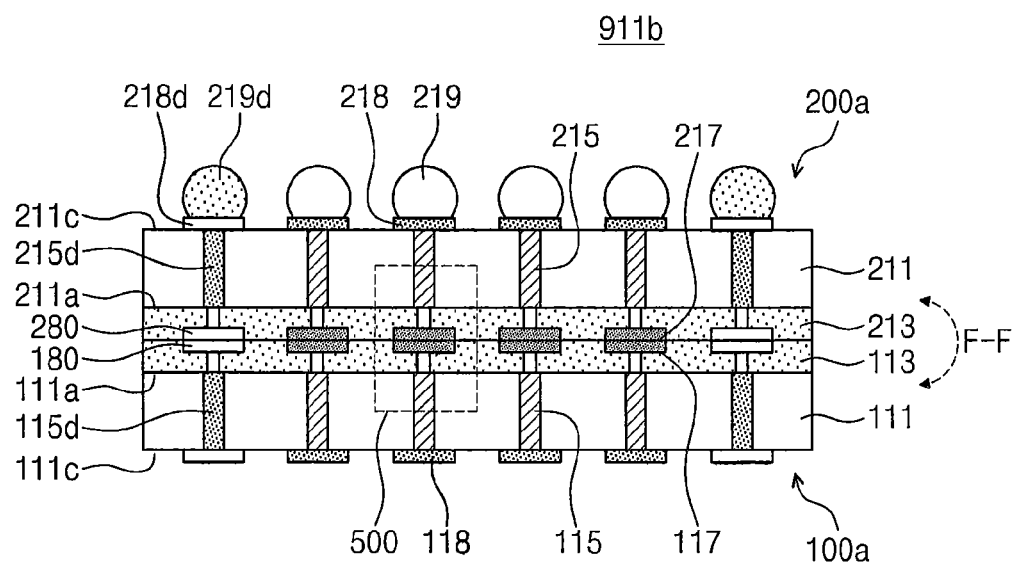
Figure 9C:
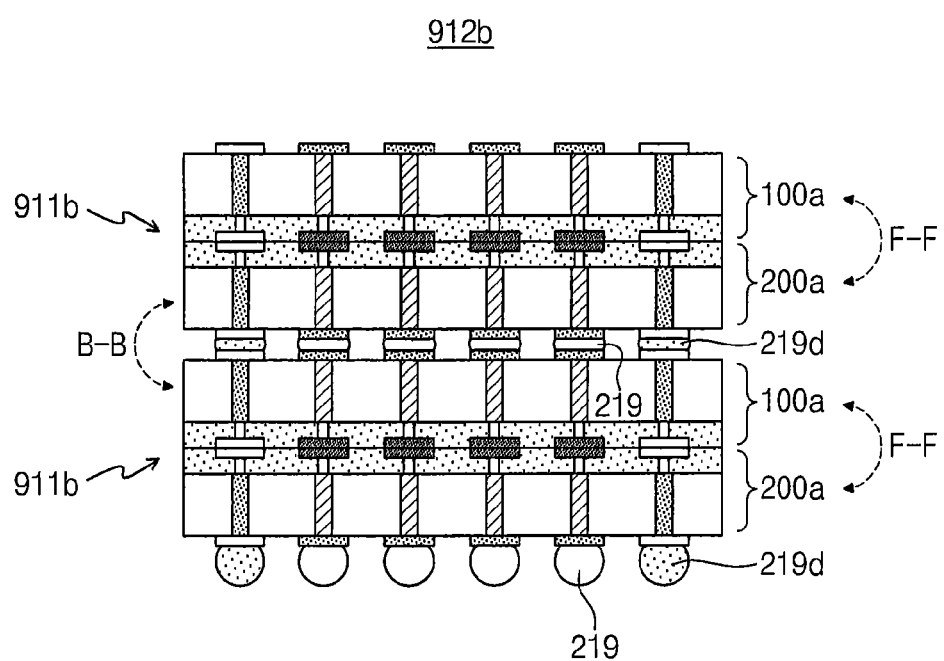

FIGS. 9A to 9C are cross-sectional views illustrating a method for fabricating a semiconductor device according to an exemplary embodiment of the present inventive concept.

Referring to FIG. 9A, the wafer-level first and second semiconductor chips 100 and 200 may be bonded to have a face-to-face structure F-F by processes substantially identical or similar to those as described with reference to FIGS. 1A and 1B. The first semiconductor chip 100 may further comprise at least one first test through-electrode 115*d* and at least one first test pad 117*d* electrically connected to the first test through-electrode 117*d*. Similarly, the second semiconductor chip 200 may further comprise at least one second test through-electrode 215*d* and at least one second test pad 217*d* electrically connected to the second test through-electrode 215*d*.

Referring to FIG. 9B, a single block 911*b* may be formed to include the chip-level first and second semiconductor chips 100*a* and 200*a* that are stacked to have a face-to-face structure F-F by processes substantially identical or similar to those as described with reference to FIGS. 1C to 1H. The single block 911*b* may comprise a portion 500 whose structural feature is substantially identical or similar to that of FIG. 2A or 2B. For example, the first test pad 117*d* may directly contact the second test pad 217*d*.

In an exemplary embodiment, as shown in FIG. 9A, prior to the wafer bonding process, a probe may contact the first test pad 117*d* to electrically test the first semiconductor chip 100. Likewise, prior to the wafer bonding process, a probe may contact the second test pad 217*d* to electrically test the second semiconductor chip 200.

As such, a probe contacts the first and second test pads 117*d* and 217*d* and thereby prevents or reduces damage or scratches to the first and second front pads 117 and 217. Moreover, the wafer bonding process may be performed after the electrical test of the first and second semiconductor chips 100 and 200.

Referring to FIG. 9C, a plurality of single blocks 911*b* may be stacked one atop the other to form a double block 912*b* having a hybrid structure. For example, a face-to-face structure F-F may be present at each of the single blocks 911*b* and a back-to-back structure B-B may be present between the single blocks 911*b*.

The single block 911*b* or the double block 912*b* may be mounted on the third semiconductor chip 300 or the printed circuit board so as to fabricate a semiconductor package as illustrated in FIG. 3B or 4B.

Figure 10A:
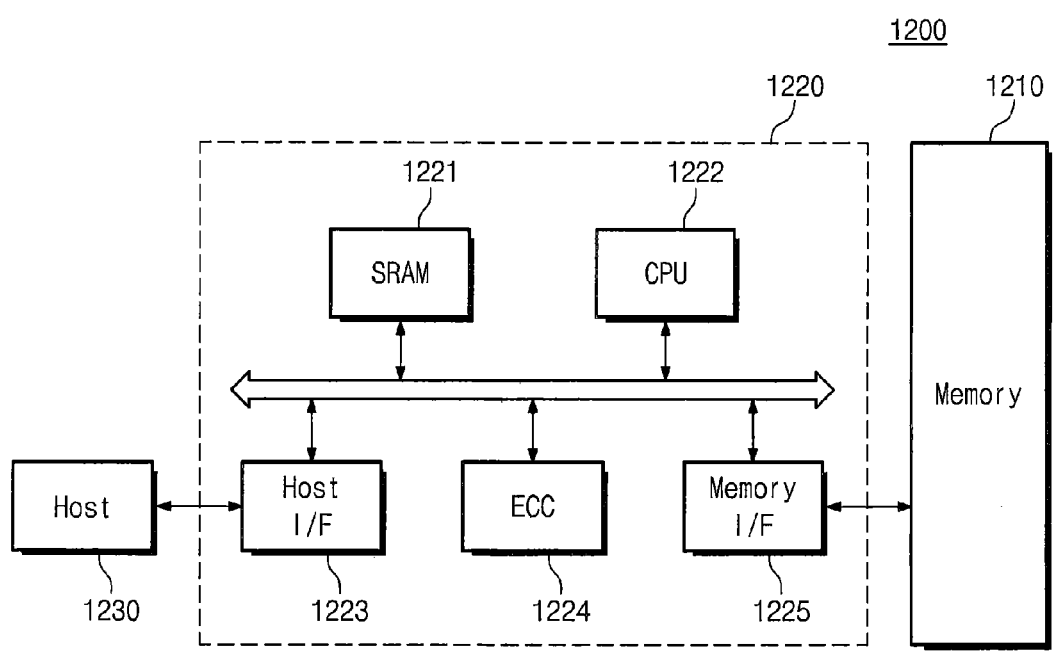
FIG. 10A is a schematic block diagram illustrating an example of memory cards including a semiconductor device according to exemplary embodiments of the present inventive concept.
Figure 10B:
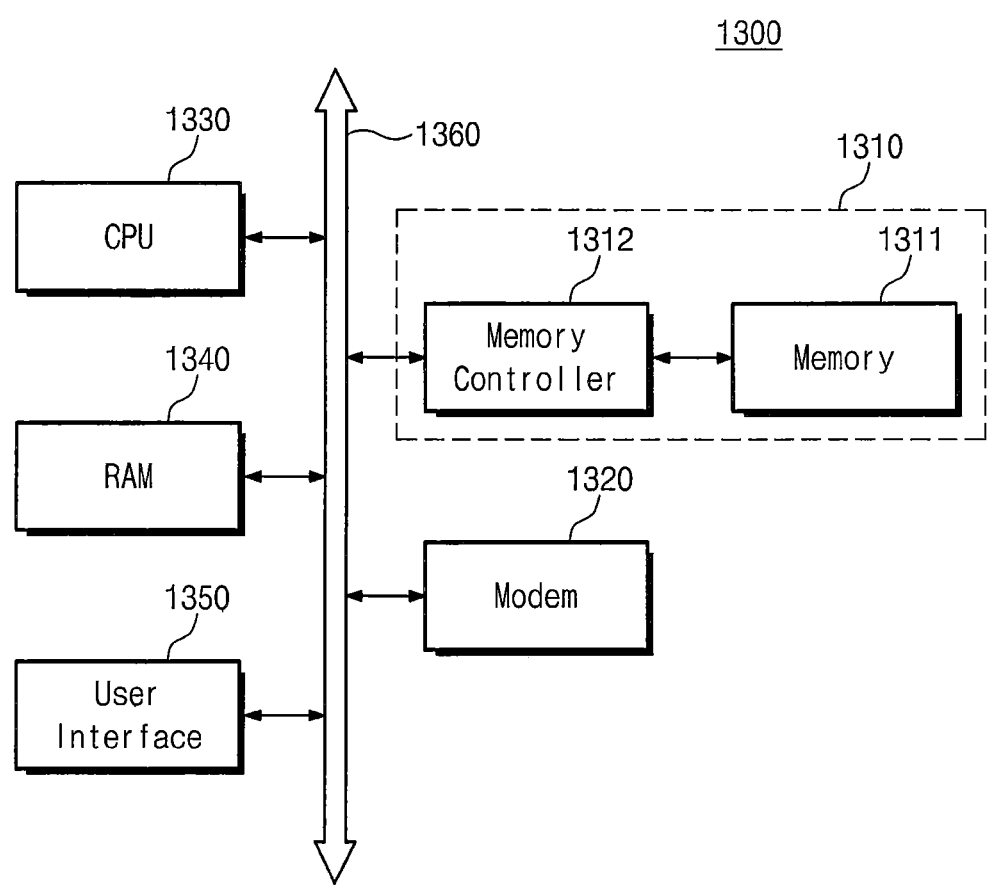
FIG. 10B is a schematic block diagram illustrating an example of information process system including a semiconductor device according to exemplary embodiments of the present inventive concept.

FIG. 10A is a schematic block diagram illustrating an example of memory cards including a semiconductor device according to exemplary embodiments of the present inventive concept. FIG. 10B is a schematic block diagram illustrating an example of information process system including a semiconductor device according to exemplary embodiments of the present inventive concept.

Referring to FIG. 10A, a semiconductor memory 1210 including at least one of the semiconductor devices according to exemplary embodiments of the inventive concepts is applicable to a memory card 1200. For example, the memory card 1200 may include a memory controller 1220 generally controlling data exchange between a host 1230 and the flash memory device 1210. An SRAM 1221 is used as a work memory of a processing unit 1222. A host interface 1223 has a data exchange protocol of a host connected to the memory card 1200. An error correction coding block 1224 detects and corrects errors of data that are read from the multi-bit flash memory device 1210. A memory interface 1225 interfaces the semiconductor memory device 1210. The processing unit 1222 generally controls data exchange of the memory controller 1220.

Referring to FIG. 10B, an information processing system 1300 may include a memory system 1310 having at least one of the semiconductor devices according exemplary embodiments of the inventive concepts. The information processing system 1300 includes a mobile device or a computer. For example, the information processing system 1300 may include a modem 1320, a central processing unit 1330, a RAM 1340, and a user interface 1350 electrically connected to the memory system 1310 via a system bus 1360. The memory 1310 may include a memory 1311 and a memory controller 1312 and have substantially the same configuration as that of the memory card 1200 in FIG. 10A.

The memory system 1310 stores data processed by the central processing unit 1330 or data input from the outside.

The information process system 1300 may be provided as a memory card, a solid state disk, a semiconductor device disk, a camera image sensor, and other application chipsets. In some embodiments, the memory system 1310 may be used as a portion of a solid state drive (SSD), and in this case, the information processing system 1300 may stably and reliably store a large amount of data in the memory system 1310.

According to embodiments of the present invention, a wafer-level stacking process is performed one time such that wafer consumption is reduced. After or before a dicing process, good chips are selected to stack to form a single block and single blocks are stacked to form a double block, thereby improving yield.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A semiconductor device comprising:
   at least one single block including a first semiconductor chip and a second semiconductor chip stacked thereon,
   wherein the first semiconductor chip comprises:
   a first semiconductor substrate including a first through-electrode;
   a first circuit layer on a front surface of the first semiconductor substrate; and
   a first front pad in the first circuit layer and is electrically connected to the first through-electrode,
   wherein the second semiconductor chip comprises:
   a second semiconductor substrate including a second through-electrode;
   a second circuit layer on a front surface of the second semiconductor substrate; and
   a second front pad in the second circuit layer and is electrically connected to the second through-electrode,
   wherein the front surface of the first semiconductor substrate faces the front surface of the second semiconductor substrate, and
   wherein the first circuit layer directly contacts the second circuit layer such that the first semiconductor chip is bonded to the second semiconductor chip.

2. The device of claim 1, wherein
   the first semiconductor chip further comprises at least one first test pad that is electrically connected to the first through-electrode and is configured to electrically test the first semiconductor chip, and
   the second semiconductor chip further comprises at least one second test pad that is electrically connected to the second through-electrode and is configured to electrically test the second semiconductor chip.

3. The device of claim 1, wherein
   the first circuit layer comprises a first upper insulating layer whose surface is coplanar with a surface of the first front pad, wherein the first upper insulating layer is configured to inhibit a constituent of the first front pad from being diffused, and
   the second circuit layer comprises a second upper insulating layer whose surface is coplanar with a surface of the second front pad, wherein the second upper insulating layer is configured to inhibit a constituent of the second front pad from being diffused,
   wherein the surface of the first upper insulating layer directly contacts the surface of the second upper insulating layer.

4. The device of claim 3, wherein
   the first circuit layer further comprises a first interlayer dielectric layer between the first semiconductor substrate and the first upper insulating layer to cover a first integrated circuit on the first semiconductor substrate, and
   the second circuit layer further comprises a second interlayer dielectric layer between the second semiconductor substrate and the second upper insulating layer to cover a second integrated circuit on the second semiconductor substrate.

5. The device of claim 1, wherein the first and second front pads directly contact each other such that the first and second through-electrodes are electrically connected to each other.

6. The device of claim 1, wherein
   the first semiconductor chip further comprises a first backside pad on a backside surface of the first semiconductor substrate electrically connected to the first through-electrode, and
   the second semiconductor chip further comprises a second backside pad on a backside surface of the second semiconductor substrate electrically connected to the second through-electrode.

7. The device of claim 6, wherein at least one of the first and second semiconductor chips further comprises a backside insulating layer on the backside surface of the corresponding semiconductor substrate,
   wherein the backside insulating layer includes a surface coplanar with a surface of corresponding backside pad.

8. The device of claim 6, further comprising an interconnection terminal coupled to at least one of the first and second backside pads.

9. A semiconductor device comprising:
   a first single block comprising two first semiconductor chips that are stacked one atop the other and having a first face-to-face structure in which front surfaces of the first semiconductor chips face each other; and
   a second single block, which is stacked on the first single block, comprising two second semiconductor chips that are stacked one atop the other and having a second face-to-face structure in which front surfaces of the second semiconductor chips face each other,
   wherein each of the first semiconductor chips comprises:
   a first semiconductor substrate having a first top surface on which a first circuit layer is provided and a first bottom surface opposite the first top surface;
   a first through-electrode penetrating the first semiconductor substrate and electrically connected to the first circuit layer;
   a first front pad in the first circuit layer and electrically connected to the first through-electrode;
   a first interlayer dielectric layer on the first top surface of the first semiconductor substrate to cover the first circuit layer; and
   a first upper insulating layer on the first interlayer dielectric layer configured to inhibit a constituent of the first front pad from being diffused,
   wherein the first front surfaces of the first semiconductor substrates included in the first single block face each other to constitute the first face-to-face structure such that the first upper insulating layers and the first front pads of the first semiconductor chips respectively face each other.

10. The device of claim 9, wherein each of the second semiconductor chips comprises:
- a second semiconductor substrate having a second top surface on which a second circuit layer is provided and a second bottom surface opposite the second top surface;
- a second through-electrode penetrating the second semiconductor substrate and electrically connected to the second circuit layer;
- a second front pad in the second circuit layer and electrically connected to the second through-electrode;
- a second interlayer dielectric layer on the second top surface of the second semiconductor substrate to cover the second circuit layer; and
- a second upper insulating layer on the second interlayer dielectric layer configured to inhibit a constituent of the second front pad from being diffused,
- wherein the second front surfaces of the second semiconductor substrates included in the second single block face each other to constitute the second face-to-face structure such that the second upper insulating layers and the second front pads of the second semiconductor chips respectively face each other.

11. The device of claim 10, wherein
the first semiconductor chips respectively further comprise first backside pads on the first bottom surfaces of corresponding first semiconductor substrates and electrically connected to corresponding first through-electrodes, and
the second semiconductor chips respectively further comprise second backside pads on the second bottom surfaces of corresponding second semiconductor substrates and electrically connected to corresponding second through-electrodes.

12. The device of claim 11, wherein the first and second single blocks are bonded to each other to have a back-to-back structure in which the first backside pad of the first semiconductor chip included in one of the first and second single blocks faces the second backside pad of the second semiconductor chip included in the other of the first and second single blocks.

13. The device of claim 12, further comprising at least one interconnection terminal between the first and second single blocks to electrically connect the first backside pad of the first semiconductor chip to the second backside pad of the second semiconductor chip,
wherein the first single block is spaced from the second single block by the interconnection terminal.

14. The device of claim 9, wherein the second semiconductor chips of the second single block comprises:
- a third semiconductor chip on the first single block, the third semiconductor chip including a third top surface and a third bottom surface opposite the third top surface; and
- a fourth semiconductor chip on the third semiconductor chip, the fourth semiconductor chip including a fourth top surface and a fourth bottom surface opposite the fourth top surface,
- wherein the third and fourth semiconductor chips constitute the second face-to-face structure in which the third top surface of the third semiconductor chip faces the fourth top surface of the fourth semiconductor chip, and
- wherein the fourth semiconductor chip has a thickness greater than that of the third semiconductor chip.

15. The device of claim 14, further comprising at least one interconnection terminal between the first and second single blocks to electrically connect the first single block to the second single block,
wherein the first single block is spaced from the second single block by the interconnection terminal.

16. A semiconductor device, comprising:
a single block diced from a two-level wafer stack, the single block comprising:
- a first semiconductor chip having a first active surface and a first circuit layer disposed on the first active surface; and
- a second semiconductor chip having a second active surface and a second circuit layer disposed on the second active surface, the second semiconductor chip being stacked on the first semiconductor chip;
wherein the first and second circuit layers abut each other in a face-to-face structure.

17. The semiconductor device of claim 16, further comprising:
- a first front pad disposed in the first circuit layer and being coplanar therewith; and
- a second front pad disposed in the second circuit layer and being coplanar therewith;
- wherein the first pad abuts the second pad in the face-to-face structure.

18. The semiconductor device of claim 17, further comprising:
- a first through-electrode extending into the first semiconductor chip and electrically connected to the first front pad; and
- a second through-electrode extending into the second semiconductor chip and electrically connected to the second front pad.

19. The semiconductor device of claim 16, wherein the first circuit layer comprises:
- a first interlayer dielectric layer disposed on the first active surface; and
- a first upper insulating layer on the first interlayer dielectric layer;
wherein the second circuit layer comprises:
- a second interlayer dielectric layer disposed on the second active surface; and
- a second upper insulating layer on the second interlayer dielectric layer.

20. The semiconductor device of claim 19, wherein the first and second upper insulating layers directly abut each other in the face-to-face structure.

* * * * *